(12) United States Patent  
Shingu et al.

(10) Patent No.: US 9,379,320 B2  
(45) Date of Patent: Jun. 28, 2016

(54) NONVOLATILE MEMORY DEVICE

(75) Inventors: Masao Shingu, Kanagawa-ken (JP); Akira Takashima, Tokyo (JP); Koichi Muraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/362,832

(22) Filed: Jan. 31, 2012

(65) Prior Publication Data

US 2012/0193597 A1  Aug. 2, 2012

Related U.S. Application Data

(63) Continuation of application No. PCT/JP2009/063702, filed on Jul. 31, 2009.

(51) Int. Cl.
| | |
|---|---|
| *H01L 45/00* | (2006.01) |
| *H01L 27/06* | (2006.01) |
| *H01L 27/24* | (2006.01) |
| *H01L 27/10* | (2006.01) |

(52) U.S. Cl.
CPC .......... *H01L 45/1273* (2013.01); *H01L 27/101* (2013.01); *H01L 27/2436* (2013.01); *H01L 27/2463* (2013.01); *H01L 45/08* (2013.01); *H01L 45/1226* (2013.01); *H01L 45/146* (2013.01); *H01L 45/1616* (2013.01); *H01L 45/1675* (2013.01)

(58) Field of Classification Search
CPC .......... H01L 45/00; H01L 27/06; H01L 27/24
USPC ................ 257/2, E45.002, E27.004, E27.017
See application file for complete search history.

(56) References Cited

U.S. PATENT DOCUMENTS

| | | | | |
|---|---|---|---|---|
| 5,751,037 A | * | 5/1998 | Aozasa et al. | 257/315 |
| 6,411,548 B1 | * | 6/2002 | Sakui et al. | 365/185.17 |
| 2003/0201478 A1 | * | 10/2003 | Tani et al. | 257/296 |

(Continued)

FOREIGN PATENT DOCUMENTS

| | | |
|---|---|---|
| JP | 2004-266167 A | 9/2004 |
| JP | 2007-110068 | 4/2007 |

(Continued)

OTHER PUBLICATIONS

Title: phase Visited date: Mar. 19, 2013 Publisher: Oxford English Dictionary (www.oed.com) Pertinent Page: 16 Pages.*

(Continued)

*Primary Examiner* — Jerome Jackson, Jr.  
*Assistant Examiner* — Lamont Koo  
(74) *Attorney, Agent, or Firm* — Oblon, McClelland, Maier & Neustadt, L.L.P.

(57) ABSTRACT

According to one embodiment, a nonvolatile memory device includes a memory section. The memory section includes a first insulating layer, a second insulating layer and a pair of electrodes. The second insulating layer is formed on and in contact with the first insulating layer. The second insulating layer has at least one of a composition different from a composition of the first insulating layer and a phase state different from a phase state of the first insulating layer. The pair of electrodes is capable of passing a current through a current path along a boundary portion between the first insulating layer and the second insulating layer. An electrical resistance of the current path is changed by a voltage applied between the pair of electrodes.

23 Claims, 27 Drawing Sheets

(56) References Cited

U.S. PATENT DOCUMENTS

| | | | | |
|---|---|---|---|---|
| 2004/0264064 | A1* | 12/2004 | Sakakima | 360/322 |
| 2007/0063238 | A1* | 3/2007 | Kaibara et al. | 257/295 |
| 2008/0173975 | A1* | 7/2008 | Chen et al. | 257/529 |
| 2008/0251816 | A1* | 10/2008 | Tanaka et al. | 257/255 |

FOREIGN PATENT DOCUMENTS

| | | |
|---|---|---|
| JP | 2008-306004 | 12/2008 |
| JP | 2008-306005 | 12/2008 |
| JP | 2009-500867 | 1/2009 |
| JP | 2009-76670 | 4/2009 |
| JP | 2009-124175 | 6/2009 |
| JP | 2009-146943 | 7/2009 |

OTHER PUBLICATIONS

International Search Report issued on Nov. 2, 2009 for PCT/JP2009/063702 filed on Jul. 31, 2009 with English Translation of Categories.

International Written Opinion issued on Nov. 2, 2009 for PCT/JP2009/063702 filed on Jul. 31, 2009.

The Extended Abstracts (The 56$^{th}$ Spring Meeting, 2009); The Japan Society of Applied Physics and Related Societies, 4p-J14, p. 531.

Office Action issued Aug. 6, 2013 in Japanese Patent Application No. 2011-524607 with English language translation.

Office Action issued Jun. 4, 2013 in Japanese Application No. 2011-524607 (With English Translation).

* cited by examiner

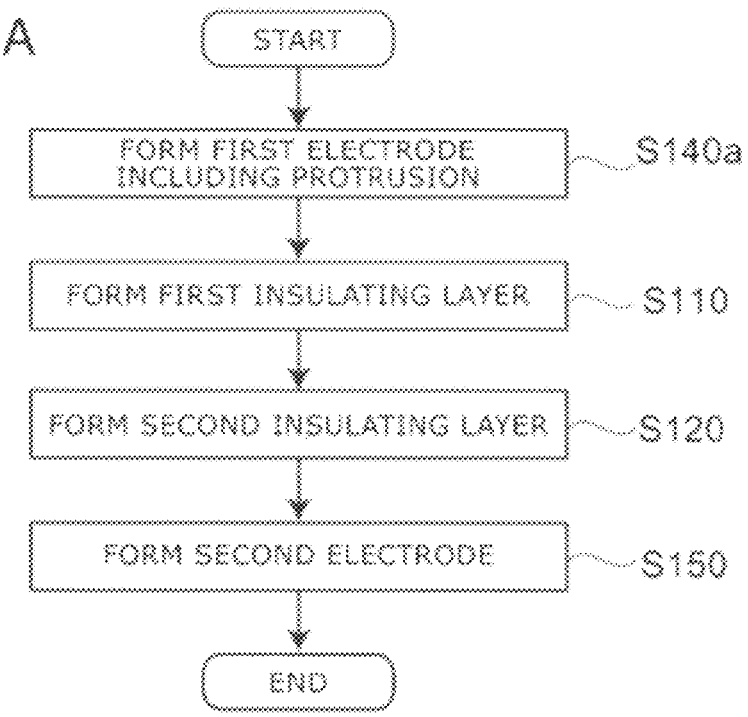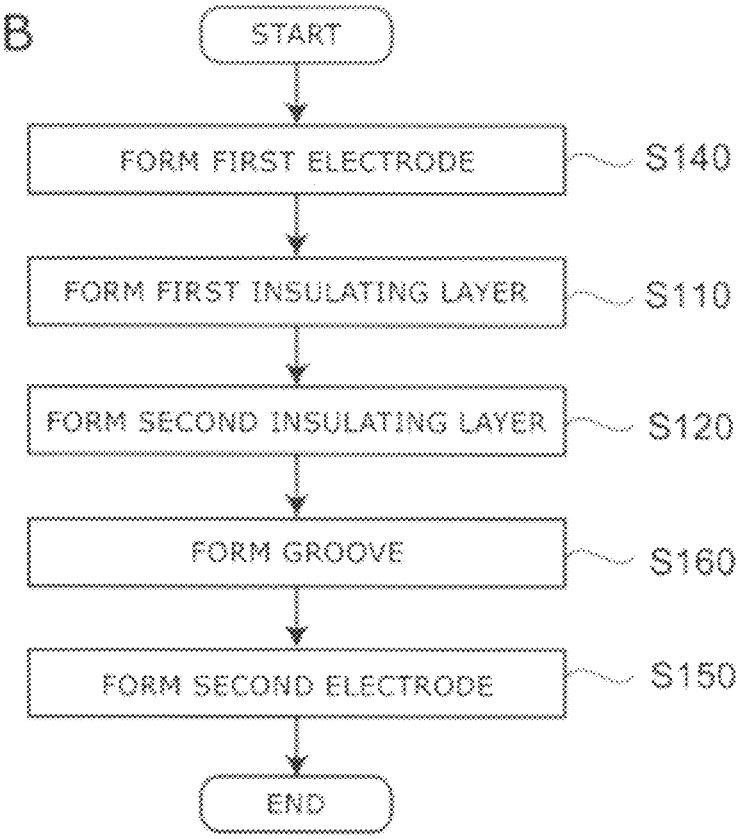

NONVOLATILE MEMORY DEVICE

CROSS-REFERENCE TO RELATED APPLICATIONS

This is a continuation application of International Application PCT/JP2009/063702, filed on Jul. 31, 2009; the entire contents of which are incorporated herein by reference.

FIELD

Embodiments of the invention described herein relate generally to a nonvolatile memory device.

BACKGROUND

There is known a nonvolatile memory device based on an element with the resistance changing in response to electrical stimulation. This element is subjected to a forming process for applying high voltage to an insulating material provided between electrodes to form a filament constituting a conductive path. However, filaments formed by the forming process are nonuniform, and variations occur in the forming voltage. This may result in destruction of the element during the forming process. Another problem is that the characteristics during the memory operation are unstable.

Patent Document 1 (JP-A 2008-306005) discloses a configuration for filament generation. Structures containing a metal oxide are brought into physical contact with each other along a hole (line) extending from a first electrode to a second electrode. Thus, a filament is generated in this hole and on its extension. However, this method is still insufficient in the controllability for forming a conductive path, and there is room for improvement.

BRIEF DESCRIPTION OF THE DRAWINGS

FIG. 27A and FIG. 27B are flow charts showing a method for manufacturing the nonvolatile memory device;

DETAILED DESCRIPTION

Figure 1A:
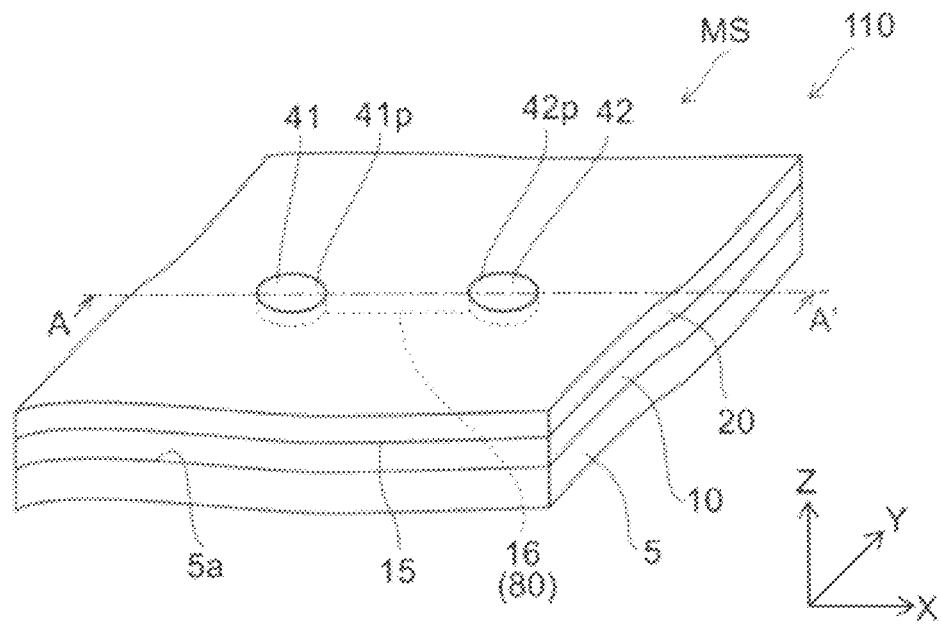
FIG. 1A and FIG. 1B are schematic views showing a nonvolatile memory device according to a first embodiment.

According to one embodiment, a nonvolatile memory device includes a memory section. The memory section includes a first insulating layer, a second insulating layer and a pair of electrodes. The second insulating layer is formed on and in contact with the first insulating layer. The second insulating layer has at least one of a composition different from a composition of the first insulating layer and a phase state different from a phase state of the first insulating layer. The pair of electrodes is capable of passing a current through a current path along a boundary portion between the first insulating layer and the second insulating layer. An electrical resistance of the current path is changed by a voltage applied between the pair of electrodes.

Various embodiments of the invention will be described hereinafter in detail with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted as appropriate.

First Embodiment

Figure 1B:
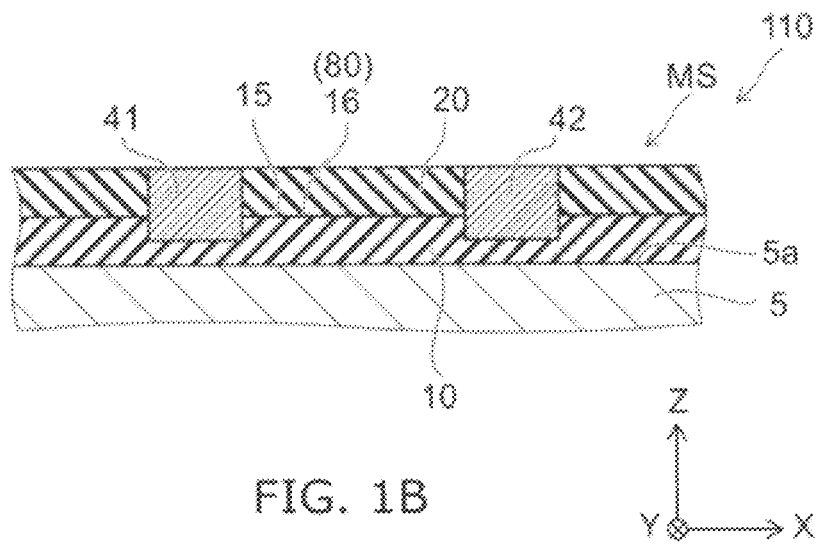

FIGS. 1A and 1B are schematic views illustrating the configuration of a nonvolatile memory device according to a first embodiment.

More specifically, FIG. 1A is a schematic perspective view, and FIG. 1B is a sectional view taken along line A-A' of FIG. 1A.

As shown in FIGS. 1A and 1B, the nonvolatile memory device 110 according to the embodiment includes a memory section MS.

The memory section MS includes a first insulating layer 10, a second insulating layer 20, and a pair of electrodes (first electrode 41 and second electrode 42).

In the specific example, the first insulating layer 10 and the second insulating layer 20 are provided on a major surface 5a of a substrate 5 and in parallel with the major surface 5a.

In other words, the nonvolatile memory device 110 includes the substrate 5 and the memory section MS. The memory section MS includes the first insulating layer 10 provided on the major surface 5a of the substrate 5, and the second insulating layer 20 provided on the first insulating layer 10.

Here, the direction perpendicular to the major surface 5a is defined as Z-axis direction (first direction). One of the directions perpendicular to the Z-axis is defined as X-axis direction (second direction). The direction perpendicular to the Z-axis direction and the X-axis direction is defined as Y-axis direction (third direction).

That is, in the specific example, the stacking direction of the first insulating layer 10 and the second insulating layer 20 is the Z-axis direction.

In the specific example, the interface between the first insulating layer 10 and the second insulating layer 20 is parallel to the major surface 5a. That is, a boundary portion 15 between the first insulating layer 10 and the second insulating layer 20 is parallel to the major surface 5a.

Here, the interface between the first insulating layer 10 and the second insulating layer 20 is strictly a surface without thickness. However, the boundary portion 15 includes the interface between the first insulating layer 10 and the second insulating layer 20, and also includes a region having a certain thickness. This thickness is far thinner than a thickness of the first insulating layer 10 and the second insulating layer 20. That is, the boundary portion 15 can include a portion of the first insulating layer 10 and the second insulating layer 20 on the interface side, the portion being thinner than the thickness of the first insulating layer 10 and the second insulating layer 20.

The boundary portion 15 extends along the interface. In practice, the major surface of the boundary portion 15 may be considered as substantially coinciding with the interface.

Thus, in the specific example, the interface (the major surface of the boundary portion 15) between the first insulating layer 10 and the second insulating layer 20 is parallel to the major surface 5a. However, the embodiment is not limited thereto. The interface may be non-parallel to the major surface 5a. For instance, the interface may be oblique to the major surface 5a. Alternatively, at least part of the interface may be a curved surface, or an uneven surface.

The second insulating layer 20 is formed in contact with the first insulating layer 10 after the first insulating layer 10 is formed.

More specifically, the first insulating layer 10 is formed in a prescribed shape (including film formation and shape processing). Then, the second insulating layer 20 is formed on at least part of a surface of the first insulating layer 10 so that at least part of the second insulating layer 20 is in contact therewith. Thus, the boundary portion 15 between the first insulating layer 10 and the second insulating layer 20 is controllably formed in a prescribed shape. That is, the position and shape of this boundary portion 15 can be accurately controlled by the surface of the initially formed first insulating layer 10, and by the pattern shape of the second insulating layer 20 stacked on at least part of the surface of the first insulating layer 10.

The second insulating layer 20 is different from the first insulating layer 10 in at least one of composition and phase state. For instance, the first insulating layer 10 and the second insulating layer 20 include different elements. Alternatively, for instance, if the first insulating layer 10 and the second insulating layer 20 include the same element, the first insulating layer 10 and the second insulating layer 20 are different in the composition ratio of that element. Alternatively, for instance, if the first insulating layer 10 and the second insulating layer 20 include the same element, the first insulating layer 10 and the second insulating layer 20 are different in phase state. Here, the phase state includes e.g. monocrystalline, polycrystalline, microcrystalline, and amorphous states. Furthermore, in the case of crystal, the phase state includes its crystal orientation.

The pair of electrodes (first electrode 41 and second electrode 42) can pass a current along the boundary portion 15 between the first insulating layer 10 and the second insulating layer 20. Because the boundary portion 15 extends along the interface, the current flows along the interface between the first insulating layer 10 and the second insulating layer 20.

Here, as described above, the first insulating layer 10 and the second insulating layer 20 are different in at least one of composition and phase state. Hence, in the boundary portion 15, the current flows more easily than in the portion other than the boundary portion 15 of the first insulating layer 10 and the second insulating layer 20. That is, a current path 16 is formed in the boundary portion 15. The mechanism of the formation of the current path 16 in the boundary portion 15 is described later in detail.

The first electrode 41 and the second electrode 42 are provided at different positions of the boundary portion 15 (different positions in the plane parallel to the major surface 5a, and in the specific example, different positions in the X-axis direction) so as to be electrically connected to the boundary portion 15. This allows the first electrode 41 and the second electrode 42 to pass a current along the boundary portion 15.

In the specific example, the first electrode 41 and the second electrode 42 are provided in contact with the boundary portion 15.

However, as described later, between the boundary portion 15 and at least one of the first electrode 41 and the second electrode 42, an intermediate layer described later may be provided. This intermediate layer is e.g. a layer which has a lower electrical resistance than the first insulating layer 10 and the second insulating layer 20, and which does not prevent the passage of current between the boundary portion 15 and at least one of the first electrode 41 and the second electrode 42.

In the specific example, the first electrode 41 and the second electrode 42 extend in the Z-axis direction. The first electrode 41 and the second electrode 42 penetrate through the second insulating layer 20 to the boundary portion 15, and further extend to a position halfway through the thickness of the first insulating layer 10.

Here, as illustrated in FIG. 1A, in the specific example, the first electrode 41 and the second electrode 42 are shaped like a circle (also including an ellipse or flat circle) in the cross section cut along a plane parallel to the major surface 5a. Thus, the location where the first electrode 41 and the second electrode 42 are closest to each other is substantially like a point in each of the first electrode 41 and the second electrode 42. The portion including the line segment connecting these points constitutes an electric field concentration portion where the electric field is maximized between the first electrode 41 and the second electrode 42. Hence, in the boundary portion 15, this electric field concentration portion substantially constitutes the current path 16.

Thus, at least one of the pair of electrodes (first electrode 41 and second electrode 42) can include a protrusion (first protrusion 41p and second protrusion 42p) protruding toward the other of the pair of electrodes. In the specific example, this protrusion is the outward convex portion of a circular cross-sectional shape. In this case, each of the pair of electrodes includes a protrusion protruding toward the other. By such a structure, an electric field concentration portion is made. Thus, in the boundary portion 15 based on the two-dimensional interface, it is easier to form the current path 16 particularly in this electric field concentration portion. This further enhances the accuracy for controlling the position and shape of the current path 16.

However, the embodiment is not limited thereto. As described later, the shape of the first electrode 41 and the second electrode 42, and their positions relative to the first insulating layer 10 and the second insulating layer 20, can be variously modified.

The electrical resistance of the current path 16 where the current is passed by the first electrode 41 and the second electrode 42 can be changed by the voltage applied between the first electrode 41 and the second electrode 42. That is, the current path 16 of the boundary portion 15 constitutes a resistance change portion 80.

In the case where an intermediate layer is provided between the boundary portion 15 and at least one of the first electrode 41 and the second electrode 42, the intermediate layer and the boundary portion 15 constitute a current path. This current path constitutes a resistance change portion.

The following first describes the case where no intermediate layer is provided, the first electrode 41 and the second electrode 42 are provided in contact with the boundary portion 15, and the current path 16 between the first electrode 41 and the second electrode 42 is the boundary portion 15.

In the following, an example method for manufacturing the nonvolatile memory device 110 is described.

Figure 2:
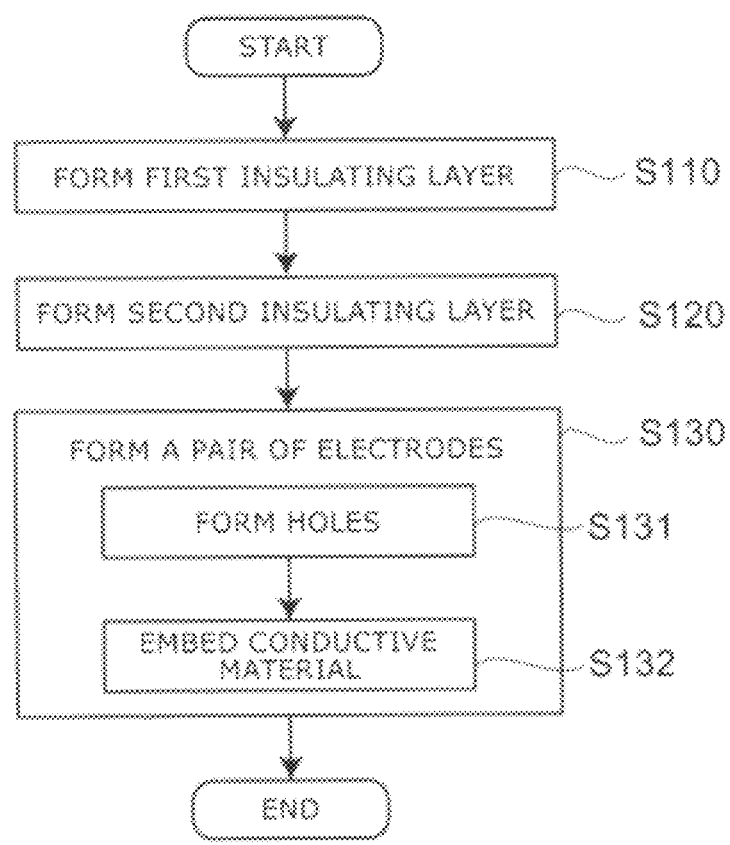
FIG. 2 is a flow chart showing a method for manufacturing the nonvolatile memory device.

FIG. 2 is a flow chart illustrating a method for manufacturing the nonvolatile memory device according to the first embodiment.

The method for manufacturing the nonvolatile memory device according to the embodiment is a method for manufacturing the nonvolatile memory device including the memory section MS. The memory section MS includes the first insulating layer 10, the second insulating layer 20 different from the first insulating layer 10 in at least one of composition and phase state, and the pair of electrodes (first electrode 41 and second electrode 42) capable of passing the current in and along the boundary portion 15 between the first insulating layer 10 and the second insulating layer 20. The electrical resistance of the current path where the current is passed is changed by the voltage applied between the pair of electrodes. The method performs the following.

As shown in FIG. 2, first, on the major surface 5a of the substrate 5, the first insulating layer 10 is formed (step S110). Then, on the first insulating layer 10, the second insulating layer 20 different from the first insulating layer 10 in at least one of composition and phase state is formed (step S120). At different positions in a plane parallel to the major surface 5a, the pair of electrodes (first electrode 41 and second electrode 42) are formed in electrical contact with the boundary portion between the first insulating layer 10 and the second insulating layer 20 (step S130).

For instance, the above step S130 includes forming holes penetrating through at least part of the second insulating layer 20 to the first insulating layer 10 (step S131) and embedding a conductive material in the holes (step S132).

In the following, one example of the manufacturing method is described.

FIGS. 3A to 3E are sequential schematic sectional views illustrating the method for manufacturing the nonvolatile memory device according to the first embodiment.

Figure 3A:
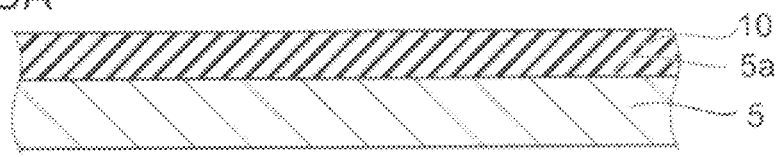
FIG. 3A to FIG. 3E are sequential schematic sectional views showing the method for manufacturing the nonvolatile memory device.

As shown in FIG. 3A, for instance, on the major surface 5a of the substrate 5 including semiconductor, the first insulating layer 10 is formed (step S110). Here, in the substrate 5, various driver circuits can be previously provided. In the specific example, the first insulating layer 10 is made of $TiO_2$ and has a thickness of 5 nm. As a film formation method, for instance, a CVD (chemical vapor deposition) method is used.

Figure 3B:
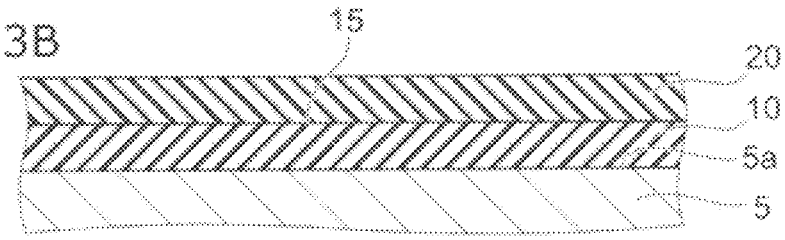

Next, as shown in FIG. 3B, the second insulating layer 20 is formed on the first insulating layer 10 (step S120). Thus, the interface (boundary portion 15) between the first insulating layer 10 and the second insulating layer 20 can be formed at a desired position in a desired shape. In the specific example, the second insulating layer 20 is made of $Al_2O_3$ and has a thickness of 5 nm. As a film formation method, for instance, an ALD (atomic layer deposition) method is used.

Here, as the film formation method for the first insulating layer 10 and the second insulating layer 20, arbitrary methods can be used besides the CVD method and the ALD method. The material and thickness used for the first insulating layer 10 and the second insulating layer 20 are not limited to the foregoing, but can be variously modified, which will be described later.

Figure 3C:
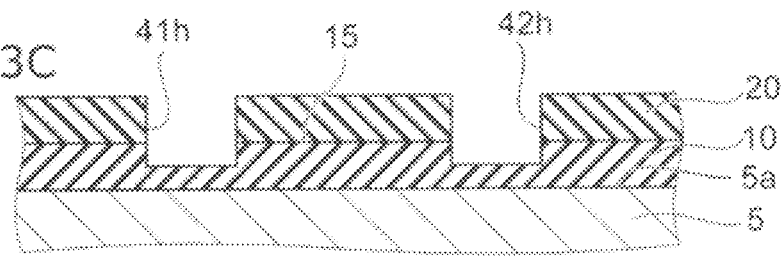

Next, as shown in FIG. 3C, by lithography and etching, contact holes 41h and 42h (holes) penetrating through the second insulating layer 20 to the first insulating layer 10 are formed (step S131). Here, the contact holes 41h and 42h may further penetrate through e.g. the first insulating layer 10 to the substrate 5.

Figure 3D:
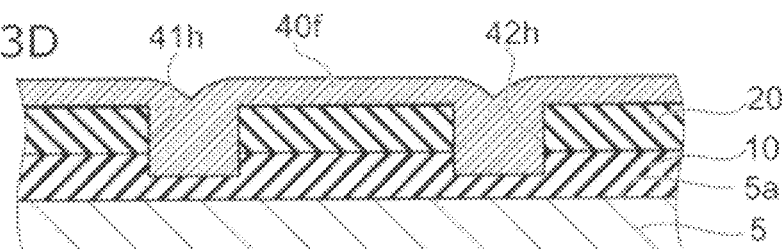

Next, as shown in FIG. 3D, a conductive film 40f (conductive material) constituting the first electrode 41 and the second electrode 42 is formed on the second insulating layer 20 and inside the contact holes 41h and 42h. That is, a conductive material is embedded in the holes (step S132). Thus, this conductive film 40f is electrically connected to the boundary portion 15. The first electrode 41 and the second electrode 42 formed from the conductive film 40f are electrically connected to the boundary portion 15. Here, the structure of the above conductive film 40f is not limited to the foregoing, and will be described later.

Figure 3E:
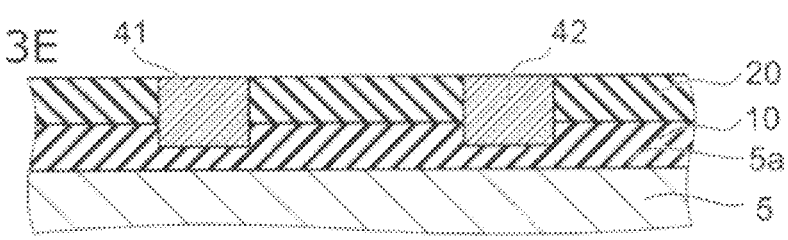

Next, as shown in FIG. 3E, by planarization using e.g. a CMP (chemical mechanical polishing) method, the second insulating layer 20 is exposed, and the conductive film 40f is separated to form the first electrode 41 and the second electrode 42 (step S130). At this time, part of the upper side of the second insulating layer 20 may also be simultaneously removed, and the thickness of the second insulating layer 20 may be thinned.

Thus, the nonvolatile memory device 110 illustrated in FIGS. 1A and 1B can be formed.

The process of separating the conductive film 40f to form the first electrode 41 and the second electrode 42 is arbitrary. For instance, this process can be performed by lithography and etching. Furthermore, in the process described with reference to FIG. 3D, the conductive film 40f can be selectively formed in the portion of the contact holes 41h and 42h. Then, the process illustrated in FIG. 3E can be omitted.

At least one of after the formation of the first insulating layer 10 and after the formation of the second insulating layer 20, heat treatment may be performed. In particular, the heat treatment after the formation of the second insulating layer 20 can control the state of the boundary portion 15 between the first insulating layer 10 and the second insulating layer 20 so that the current path 16 provides desired characteristics. Alternatively, the heat treatment may be performed after the formation of the conductive film 40f (including after separation of the conductive film 40f). This can control the state of the region between the boundary portion 15 and at least one of the first electrode 41 and the second electrode 42 so that the nonvolatile memory device provides desired characteristics.

Thus, in the nonvolatile memory device 110 according to the embodiment, first, the first insulating layer 10 is formed in a prescribed shape. Then, the second insulating layer 20 is formed in contact with the first insulating layer 10. Hence, the boundary portion 15 between the first insulating layer 10 and the second insulating layer 20 is controllably formed with high accuracy at a prescribed position in a prescribed shape.

Furthermore, the first electrode 41 and the second electrode 42 are formed after the formation of the first insulating layer 10 and the second insulating layer 20. Hence, the boundary portion 15 is not contaminated by the formation of the first electrode 41 and the second electrode 42. This facilitates suppressing the degradation of the boundary portion 15.

For instance, consider the case of forming the first insulating layer 10, then forming the first electrode 41 and the second electrode 42, and then forming the second insulating layer 20. In this case, the material constituting the first electrode 41 and the second electrode 42 is attached to the surface of the first insulating layer 10. This may make it difficult to stabilize the characteristics of the boundary portion 15. On the other hand, consider the case of forming the first electrode 41 and the second electrode 42, and then forming the first insulating layer 10 and the second insulating layer 20. In this case, it is substantially difficult to electrically connect the interface between the first insulating layer 10 and the second insulating layer 20 to the first electrode 41 and the second electrode 42.

In contrast, in the structure of the above nonvolatile memory device 110 and the manufacturing method therefore, before forming the first electrode 41 and the second electrode 42, the first insulating layer 10 and the second insulating layer 20 are formed, and the boundary portion 15 is formed. Hence, there is no contamination of the boundary portion 15. Furthermore, this can easily realize a configuration for electrically connecting the interface between the first insulating layer 10 and the second insulating layer 20 to the first electrode 41 and the second electrode 42.

Here, an example of the characteristics in the resistance change portion 80 of the nonvolatile memory device 110 is described.

Figure 4:
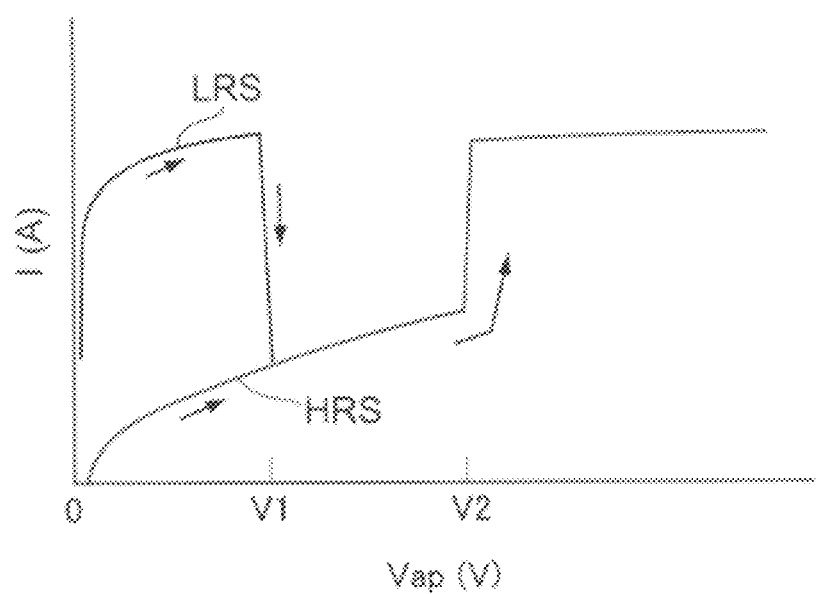
FIG. 4 is a schematic view showing the characteristics of the nonvolatile memory device.

FIG. 4 is a schematic diagram illustrating the characteristics of the nonvolatile memory device according to the first embodiment.

In this figure, the horizontal axis represents an application voltage Vap applied between the first electrode 41 and the second electrode 42. The vertical axis represents the current I flowing between the first electrode 41 and the second electrode 42 (i.e., the current flowing in the boundary portion 15 constituting the current path 16).

As shown in FIG. 4, for instance, the resistance change portion 80 (current path 16) is placed in a high resistance state HRS. In the high resistance state HRS, the application voltage Vap is increased. Then, at a second transition voltage V2 (set voltage), the resistance change portion 80 transitions from the high resistance state HRS to a low resistance state LRS, i.e., the state of relatively low resistance. This low resistance state LRS is maintained even if the application voltage Vap is eliminated. Next, in the low resistance state LRS, the application voltage Vap is increased from 0 volts. Then, at a first transition voltage V1 (reset voltage), the resistance change portion 80 transitions to the high resistance state HRS.

Such a plurality of resistance states in the resistance change portion 80 are used for memory operation. Here, in reading this resistance state (memory state), an application voltage Vap lower than the first transition voltage V1 is applied to the resistance change portion 80 to read the resistance state.

The transition from the high resistance state HRS to the low resistance state LRS is referred to as set operation. The transition from the low resistance state LRS to the high resistance state HRS is referred to as reset operation.

Here, for instance, two or more values for the limit current can be established to provide multi-valued data. Thus, the nonvolatile memory device 110 can be used as a multi-valued memory.

In the characteristics illustrated in FIG. 4, a DC voltage is applied. However, a pulse voltage can be applied for operation. Furthermore, in the characteristics illustrated in FIG. 4, the application voltage Vap has a single polarity. However, the embodiment is not limited thereto, as long as the electrical resistance changes in at least one of the magnitude and polarity of the application voltage Vap.

In the following, the mechanism of the formation of the current path 16 in the boundary portion 15 is described.

Consider the case where the first insulating layer 10 and the second insulating layer 20 are made of compounds including different elements, and are crystals. In this case, crystal mismatch occurs in the boundary portion 15. Thus, the electrical resistance in the boundary portion 15 is made lower than that in the other portion of the first insulating layer 10 and the second insulating layer 20. Hence, the boundary portion 15 constitutes the current path 16.

Alternatively, consider the case where the first insulating layer 10 and the second insulating layer 20 are made of oxides including different elements. In this case, the free energy of oxide formation of the elements included in the oxides is different. Hence, migration of oxygen ions occurs between the first insulating layer 10 and the second insulating layer 20. Thus, oxygen deficiency or oxygen excess occurs in the boundary portion 15. Hence, the boundary portion 15 constitutes the current path 16.

For instance, the first insulating layer 10 and the second insulating layer 20 are made of oxides including different elements. Furthermore, at least one of the first insulating layer 10 and the second insulating layer 20 is made of an oxide including a transition metal element. This particularly decreases the electrical resistance of the boundary portion 15. For instance, at least one of the first insulating layer 10 and the second insulating layer 20 includes an oxide including one selected from Ti, V, Mn, Co, Ni, Zr, Hf, and Pr. Then, the electrical resistance significantly changes due to the valence of transition metal ions. This can particularly decrease the electrical resistance of the boundary portion 15.

That is, at least one of the first insulating layer 10 and the second insulating layer 20 can be made of an oxide including one selected from the group (first group) consisting of Ti, V, Mn, Co, Ni, Zr, Hf, and Pr.

Alternatively, consider the case where the first insulating layer 10 and the second insulating layer 20 are made of oxides including different elements, not limited to oxides of transition metals. In this case, oxygen deficiency occurring in the boundary portion 15 forms defect levels in the band gap. This can make the electrical resistance of the boundary portion 15 lower than that of the other portion of the first insulating layer 10 and the second insulating layer 20. Examples of such oxides can include $SiO_2$, SiON, and $Al_2O_3$.

Thus, at least one of the first insulating layer 10 and the second insulating layer 20 can be made of an oxide including one selected from the group (second group) consisting of Al and Si.

That is, at least one of the first insulating layer 10 and the second insulating layer 20 can be made of an oxide including one selected from the group consisting of Ti, V, Mn, Co, Ni, Zr, Hf, Pr, Al, and Si.

Alternatively, consider the case where the first insulating layer 10 and the second insulating layer 20 are made of oxides including different elements, not limited to formation of oxygen deficiency. In this case, impurity levels due to addition of heterogeneous elements occur in the band gap of the boundary portion 15. This can make the electrical resistance of the boundary portion 15 lower than that of the other portion of the first insulating layer 10 and the second insulating layer 20.

Alternatively, consider the case where the first insulating layer 10 and the second insulating layer 20 are made of compounds including the same element with different composition ratios, and are crystals. In this case, crystal mismatch occurs, and the boundary portion 15 constitutes the current path 16. Furthermore, in the boundary portion 15, a portion occurs where the composition ratio of the element included in the first insulating layer 10 and the second insulating layer 20 sharply changes. Thus, the boundary portion 15 constitutes the current path 16.

Alternatively, consider the case where the first insulating layer 10 and the second insulating layer 20 are made of materials having different phase states. Also in this case, the electrical resistance of the boundary portion 15 is made lower than that of the other portion of the first insulating layer 10 and the second insulating layer 20. For instance, consider the case where the first insulating layer 10 and the second insulating layer 20 are made of compounds including the same element, but one of them is made of a compound with the phase including a crystal, and the other is made of a compound with an amorphous phase. In this case, mismatch in phase state occurs in the boundary portion 15. In this portion, discrete levels due to e.g. dangling bonds occur in the band gap. Thus, the boundary portion 15 constitutes the current path 16. Alternatively, for instance, consider the case where the first insulating layer 10 and the second insulating layer 20 are made of compounds including the same element with different crystal phases (including the case where the phase state of e.g. polycrystals and microcrystals is different, besides the difference in crystal phase). Also in this case, likewise, the boundary portion 15 constitutes the current path 16.

Thus, in the case where the first insulating layer 10 and the second insulating layer 20 different in at least one of composition and phase state are provided adjacently, the electrical resistance of the boundary portion 15 therebetween is made lower than that of the other portion of the first insulating layer 10 and the second insulating layer 20. This boundary portion 15 can constitute the current path 16.

Furthermore, an element imparting conductivity (hereinafter referred to as "conductive element M") can be unevenly distributed in the boundary portion 15. This makes the boundary portion 15 more likely to constitute the current path 16. That is, the boundary portion 15 includes a conductive element M, and the concentration of the conductive element M in the boundary portion 15 is higher than the concentration of the conductive element M in the other portion of the first insulating layer 10 and the second insulating layer 20.

For instance, a stable conductive element M resistant to reacting with and producing a compound with the first insulating layer 10 and the second insulating layer 20 is added in an appropriate amount to the material constituting at least one of the first insulating layer 10 and the second insulating layer 20. Then, the first insulating layer 10 and the second insulating layer 20 are formed. Subsequently, heat treatment is performed as necessary. Thus, the conductive element M segregates in the boundary portion 15. This unevenly distributed conductive element M makes the electrical resistance of the boundary portion 15 lower than that of the other portion of the first insulating layer 10 and the second insulating layer 20. Thus, the boundary portion 15 constitutes the current path 16.

The conductive element M like this can be at least one selected from the group (third group) consisting of Al, Si, Ti, Co, Ni, Cu, Sr, Y, Pd, Ag, Ta, Pt, Au, La, Sm, Er, Yb, and Lu.

Here, in the case where the first insulating layer 10 and the second insulating layer 20 are the same in composition and phase state, the conductive element M is less likely to be unevenly distributed in the boundary portion 15 even if the conductive element M is added to the first insulating layer 10 and the second insulating layer 20. Thus, also in the case where the conductive element M is added to the first insulating layer 10 and the second insulating layer 20 so as to be unevenly distributed in the boundary portion 15 therebetween, the first insulating layer 10 and the second insulating layer 20 are preferably made of materials different in at least one of composition and phase state.

Furthermore, the above conductive element M may be supplied from at least one of the first electrode 41 and the second electrode 42. For instance, by applying voltage between the first electrode 41 and the second electrode 42, the conductive element M can be moved along the boundary portion 15 (e.g., interface) from one of the first electrode 41 and the second electrode 42 to the other to further decrease the resistance of the boundary portion 15. This allows the boundary portion 15 to constitute the current path 16 more easily.

Thus, the conductive element M can be subjected to ion conduction along the boundary portion 15. In this case, the conductive element M can be at least one of e.g. Ag and Cu, which are known as ion conductors. That is, the first electrode 41 and the second electrode 42 can be made of at least one of e.g. Ag and Cu. Thus, the conductive element M can be injected into the boundary portion 15 to form the current path 16.

In the following, the mechanism in which the current path 16 formed in the boundary portion 15 constitutes the resistance change portion 80, i.e., the mechanism in which the electrical resistance of the current path 16 changes, is described.

Figure 5A:
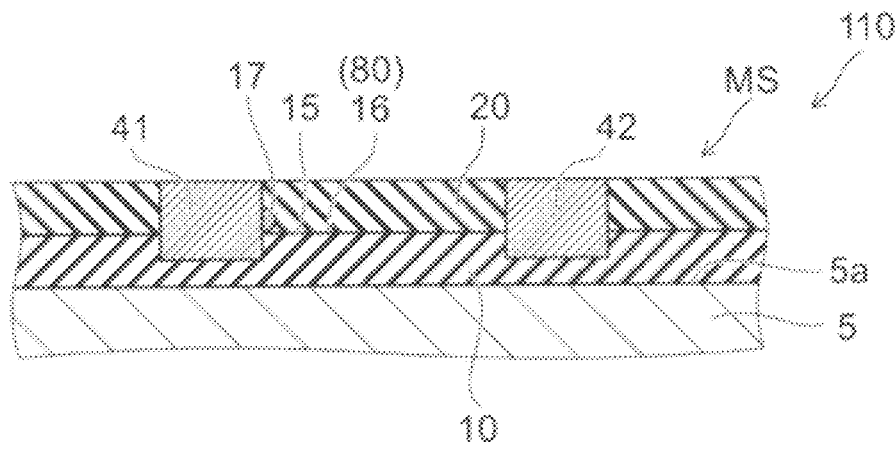
FIG. 5A to FIG. 5C are schematic sectional views showing the configuration and the operation of the nonvolatile memory devices.
Figure 5B:
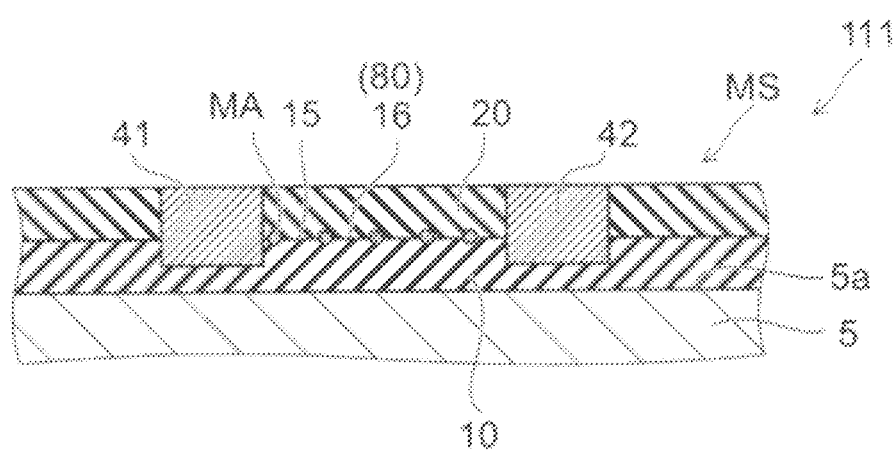
Figure 5C:
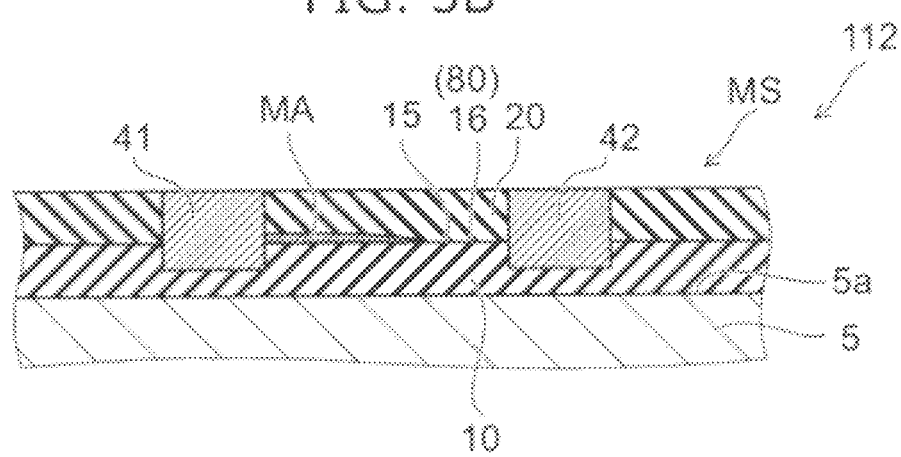

FIGS. 5A to 5C are schematic sectional views illustrating the configuration and operation of the nonvolatile memory devices according to the first embodiment.

These figures are sectional views taken along line A-A' of FIG. 1A.

As shown in FIG. 5A, in the first one of the mechanisms in which the electrical resistance of the current path 16 changes (first mechanism), the reaction portion 17 is formed in the portion in contact with the interface of at least one of the first insulating layer 10 and the second insulating layer 20 (at least part of the boundary portion 15). In the reaction portion 17, at least one of oxidation reaction and reduction reaction occurs. Depending on the state of this reaction portion 17, the electrical resistance of the boundary portion 15 constituting the current path 16 changes.

In this case, at least one of the first insulating layer 10 and the second insulating layer 20 is made of a resistance change material (a material whose electrical resistance is changed by the application voltage). Thus, the above reaction portion 17 is formed, and the electrical resistance of the boundary portion 15 constituting the current path 16 changes. The material whose electrical resistance is changed by the application voltage can be a transition metal oxide. Specifically, examples of this material can include $TiO_2$, $NiO$, $ZrO_2$, $HfO_2$, $PrCaMnO$, and $Al_2O_3$. However, this material is not limited thereto. For instance, this material can be an oxide including one selected from the first group and the second group described above.

In such materials, the electrical resistance is changed by the application voltage. Conventionally, a process for applying high voltage to these materials (forming process) is performed to form a filament constituting a conductive path in these materials. The electrical resistance of this filament is changed by the application voltage. More specifically, for instance, by the current flowing in the filament, oxidation/reduction reaction occurs in these materials. As a result, the electrical resistance of the filament changes.

However, in the nonvolatile memory device 110 according to the embodiment, the filament is formed in these materials not by the forming process. The filament is formed by causing e.g. oxidation/reduction reaction in the boundary portion 15 (including the portion of at least one of the first insulating layer 10 and the second insulating layer 20 in contact with the interface) so as to reduce the electrical resistance of the boundary portion 15.

More specifically, as shown in FIG. 5A, the reaction portion 17 is formed in the portion of at least one of the first insulating layer 10 and the second insulating layer 20 in contact with the interface. In the reaction portion 17, at least one of oxidation reaction and reduction reaction occurs. This reaction portion 17 is formed e.g. near at least one of the first electrode 41 and the second electrode 42. This reaction portion 17 changes the electrical resistance of the current path 16 including the boundary portion 15.

Thus, the first mechanism is realized in the following case. The memory section MS of the nonvolatile memory device 110 includes the first insulating layer 10, and the second insulating layer 20 different from the first insulating layer 10 in at least one of composition and phase state. At least one of the first insulating layer 10 and the second insulating layer 20 includes a transition metal compound.

As shown in FIGS. 5B and 5C, in other nonvolatile memory devices 111 and 112 according to the embodiment, the conductive element M is unevenly distributed in the boundary portion 15. That is, the boundary portion 15 includes a high concentration region MA containing the conductive element M at high concentration.

That is, in the nonvolatile memory device 111, the conductive element M is unevenly distributed in the high concentration region MA which is a separate region in the boundary portion 15.

On the other hand, in the nonvolatile memory device 112, the conductive element M is unevenly distributed in the high concentration region MA which is a continuous region. In this case, the high concentration region MA where the conductive element M is unevenly distributed is connected to the first electrode 41.

The state of such a region where the conductive element M is unevenly distributed is changed by the voltage applied between the first electrode 41 and the second electrode 42.

More specifically, in the second one of the mechanisms in which the electrical resistance of the current path 16 changes (second mechanism), the region where the conductive element M is unevenly distributed in the boundary portion 15 (high concentration region MA) is changed by the voltage applied between the first electrode 41 and the second electrode 42. This changes the electrical resistance of the boundary portion 15, and the second mechanism is based on this change.

For instance, the conductive element M is moved between the first electrode 41 and the second electrode 42 along the boundary portion 15 in response to the application voltage. This changes the electrical resistance of the boundary portion 15 constituting a current path 16. This phenomenon can be regarded as a kind of ion conduction.

In using the second mechanism as described above, the first insulating layer 10 and the second insulating layer 20 do not necessarily need to include e.g. the transition metal oxide as described above. However, also in this case, the first insulating layer 10 and the second insulating layer 20 may include a material having resistance change characteristics (e.g., the transition metal oxide as described above).

Thus, the second mechanism is realized as follows. The memory section MS of the nonvolatile memory devices 111 and 112 includes the first insulating layer 10, and the second insulating layer 20 different from the first insulating layer 10 in at least one of composition and phase state. The conductive element M is unevenly distributed in the boundary portion 15 between the first insulating layer 10 and the second insulating layer 20. The distribution of the conductive element M in the boundary portion 15 is changed by the application voltage.

The concentration of this conductive element M in the boundary portion 15 is higher than the concentration in the other portion of the first insulating layer 10 and the second insulating layer 20. The portion containing the conductive element M at high concentration is formed by segregation of the conductive element M from the first insulating layer 10 and the second insulating layer 20, or by migration of the conductive element M from at least one of the first electrode 41 and the second electrode 42. Then, for instance, the concentration of the conductive element M in the boundary portion 15 is changed by the application voltage. The conductive element M includes at least one of Ag and Cu.

The nonvolatile memory devices 111 and 112 can be formed by appropriately selecting at least one of the material used for the first insulating layer 10 and the second insulating layer 20, and the material used for the first electrode 41 and the second electrode 42 to unevenly distribute the conductive element M in the boundary portion 15.

Here, at least one of after the formation of the first insulating layer 10 and after the formation of the second insulating layer 20 described with reference to FIGS. 3A and 3B, the heat treatment may be performed to facilitate unevenly distributing the conductive element M in the boundary portion 15.

In the case where the conductive element M is introduced into the boundary portion 15 from at least one of the first electrode 41 and the second electrode 42, this introduction can be efficiently performed by the heat treatment after the formation of the conductive film 40f described with reference to FIG. 3D.

By the first and second mechanisms described above, the electrical resistance of the current path 16 is changed by the application voltage. In the embodiment, the current path 16 is the boundary portion 15 between the first insulating layer 10 and the second insulating layer 20. Hence, the position and shape of the current path 16 are accurately controlled.

On the other hand, for instance, in a first comparative example, a resistance change material such as a transition metal oxide is provided between a pair of electrodes to form a conventional resistance change element. In this case, the filament constituting a current path is formed by a technique such as forming. This filament is formed from e.g. various grain boundaries, which are most susceptible to voltage. Thus, the shape of the filament is indefinite, and the formation position and shape of the filament are difficult to control. Thus, variations occur in the voltage of the forming process. Hence, device destruction is likely to occur, and the characteristics are also unstable.

Furthermore, in a second comparative example, the resistance change portion includes a configuration in which a first region and a second region different in at least one of composition and phase are mixed. The interface between the first region and the second region is used as a filament. In this case, the interface is formed by the nanocrystal technique. Thus, again, the shape of the interface is indefinite, and the position and shape of the interface are difficult to control. Thus, the current path is nonuniform. This is insufficient to stabilize the characteristics.

In a third comparative example based on a configuration described in Patent Document 1, structures containing a metal oxide are brought into physical contact with each other along a hole (line) extending from a first electrode to a second electrode. First, a hole is formed in an insulator. Inside this hole, Ti oxide is formed and embedded. The core portion formed at the center of the hole after the embedded film formation (seam portion) is used as a conductive path. In this case, this core portion is a portion where different portions of the same material are in contact with each other. Thus, as compared with the current path formed at the interface between different materials as in the embodiment, the electrical resistance of the core portion cannot be sufficiently reduced. Hence, the third comparative example is insufficient to achieve desired characteristics.

In a fourth comparative example based on another configuration described in the same Patent Document 1, first, an initial Ti oxide film is cylindrically formed inside a hole. Then, a subsequent Ti oxide film is embedded inside it. Thus, the interface between the initial Ti oxide film and the subsequent Ti oxide film is used as a conductive path. However, also in this case, the same oxide is used for the initial film and the subsequent film. Hence, the degree of concentration of the current path on the interface is lower than that of the current path formed at the interface between different materials. Thus, stabilization of the characteristics is insufficient. Furthermore, in this case, the interface is shaped like a cylinder. Hence, the conductive path is formed at an arbitrary location of the side surface of the cylinder. That is, the conductive path is formed at an electrically weakest location of the side surface of the cylinder. However, this location is difficult to control. Hence, control of the formation position and shape of the current path is still insufficient, and it is difficult to stabilize the characteristics.

Thus, in the comparative examples, the current path is nonuniform, and has low controllability. Hence, it is difficult to stabilize the characteristics.

In contrast, in the nonvolatile memory devices 110, 111, and 112 according to the embodiment, the current path 16 is formed in the boundary portion 15. This eliminates the need for the forming process. Furthermore, because the current path 16 is formed in the boundary portion 15, the position and shape of the current path 16 are accurately controlled. Thus, the embodiment can provide a nonvolatile memory device of the resistance change type with stable characteristics in which the position and shape of the current path in the resistance change portion are accurately controlled.

Furthermore, as described above, in the specific example, the cross section of the first electrode 41 and the second electrode 42 is shaped like a circle to form an electric field concentration portion. Thus, in the boundary portion 15 based on the two-dimensional interface, it is easier to form the current path 16 particularly in this electric field concentration portion. This further enhances the accuracy for controlling the position and shape of the current path 16.

In the above first to fourth comparative examples, the direction in which the pair of electrodes are opposed to each other is perpendicular to the major surface of the substrate. More specifically, the first electrode is formed on the major surface of the substrate, the resistance change portion is formed on the first electrode, and the second electrode is formed on the resistance change portion. Thus, the direction of the current path is directed perpendicular to the major surface of the substrate. In the resistance change element thus configured, the stacking direction of the electrodes and the direction of the current are limited to being perpendicular to the major surface of the substrate. This limits the configuration of the nonvolatile memory device based on the resistance change element, and limits its application field. For instance, consider a nonvolatile memory device in which the resistance change element is combined with a planar FET (field effect transistor) provided on the substrate. In this case, the resistance change element may be connected parallel to the source region and the drain region of the FET. However, as described above, in the resistance change element of the comparative examples, the stacking direction of the electrodes and the direction of the current are limited to being perpendicular to the major surface of the substrate. This is very difficult to apply to the above configuration of parallel connection.

In contrast, the memory section MS of the nonvolatile memory devices 110, 111, and 112 according to the embodiment has a novel structure in which the first insulating layer 10 and the second insulating layer 20 are stacked on the substrate 5, and a pair of electrodes are provided at different positions on the major surface 5a of the substrate 5. The current path 16 of the boundary portion 15 is generally parallel to the major surface 5a of the substrate 5. Such a structure is suitably combined with a planar FET, and expands the field of application to nonvolatile memory devices. Examples of this structure will be described later.

Here, as a structure in which the current path is parallel to the major surface of the substrate, a fifth comparative example may be considered as follows. For instance, a conductive thin film is deposited on the substrate and patterned into a prescribed shape. Then, a first interlayer insulating film is deposited thereon. An opening is formed in the first interlayer insulating film so as to expose part of the upper surface of the conductive thin film. The conductive thin film exposed through the opening is thinned. Then, the thinned conductive thin film is oxidized. Thus, this structure is obtained. In this case, the formed oxide thin film itself is used as a resistance change portion.

That is, in this structure, at least the surface of the substrate with the oxide thin film formed thereon is insulative. An interface between insulators exists between the substrate surface and the oxide thin film. Furthermore, a second interlayer insulating film is formed on the oxide thin film. An interface between insulators exists also between the oxide thin film and the second interlayer insulating film. However, the fifth comparative example is not a configuration in which the current is passed in these interface portions to use the interface portions as a resistance change portion. Rather, the fifth comparative example is a configuration in which the oxide thin film itself is used as a resistance change portion. Thus, a conductive path is formed at an electrically weakest portion in the oxide thin film having a certain thickness. Hence, the controllability of the position and shape of the conductive path is still insufficient.

Furthermore, in this structure of the fifth comparative example, the oxide thin film is formed by oxidizing (altering) the conductive thin film. Hence, even if the material of the substrate surface and the material of the oxide thin film are different, the discontinuity of the materials is not steep at the interface between the substrate surface and the oxide thin film. Thus, the ease with which the current flows at this interface is not significantly greater than in the other portion. Hence, this interface is difficult to use as a current path.

Furthermore, in the fifth comparative example, a portion of the conductive thin film initially formed on the substrate constitutes a pair of electrodes, and another portion is thinned to form an oxide thin film constituting a resistance change portion. Thus, there are limitations on the material of the electrodes and the material of the resistance change portion. Hence, it is difficult to obtain an element with high performance.

As a variation of the fifth comparative example, the following method may be considered. After forming a pair of electrodes, a conductive film different in material from the electrodes is formed thereon. Then, the conductive film is processed into a prescribed shape. Thus, this conductive film is selectively left between the electrodes. Subsequently, this conductive film is oxidized into an oxide film to form a resistance change portion. However, in this method, the surface of the conductive film is contaminated in the processing of the conductive film. Thus, it is still difficult to achieve stable characteristics.

In contrast, as described above, in the structure of the nonvolatile memory device 110 and the manufacturing method therefore, the current path 16 is parallel to the major surface 5a, and on the other hand, before forming the first electrode 41 and the second electrode 42, the first insulating layer 10 and the second insulating layer 20 are formed, and the boundary portion 15 is formed. Hence, there is no contamination of the boundary portion 15, and the characteristics are stable. Furthermore, the configuration for electrically connecting the interface between the first insulating layer 10 and the second insulating layer 20 to the first electrode 41 and the second electrode 42 can be easily realized without requiring complicated methods.

In the embodiment, the forming process may be performed for the purpose of e.g. further stabilizing the characteristics. In this case, because the current path 16 is formed in advance, conditions with reduced voltage and stress can be used in the forming process. This suppresses occurrence of e.g. device destruction.

In the nonvolatile memory devices 110, 111, and 112 according to the embodiment, the first electrode 41 and the second electrode 42 can be made of any conductive materials (including various metals, various semiconductors, and various conductive compounds). For instance, such conductive materials can include a monolayer film made of one selected from the group (fourth group) consisting of Au, Pt, Al, Cu, Ag, polycrystalline silicon, titanium nitride, tantalum nitride, titanium silicide, cobalt silicide, nickel silicide, platinum silicide, palladium silicide, erbium silicide, ytterbium silicide, lutetium silicide, samarium silicide, strontium silicide, yttrium silicide, and lanthanum silicide, or a stacked film made of a plurality selected therefrom.

The above fourth group includes ternary or higher silicides which combine silicides including a plurality of metallic elements included in the group (fifth group) consisting of titanium silicide, cobalt silicide, nickel silicide, platinum silicide, palladium silicide, erbium silicide, ytterbium silicide, lutetium silicide, samarium silicide, strontium silicide, yttrium silicide, and lanthanum silicide.

In the configuration based on the first mechanism and the second mechanism described above, the resistance change characteristics also depends on the combination of the material of the first electrode 41 and the second electrode 42 with the material of the first insulating layer 10 and the second insulating layer 20. In particular, in the case where the first electrode 41 and the second electrode 42 include Pt, stable resistance change characteristics are obtained. Hence, at least one of the first electrode 41 and the second electrode 42 preferably includes Pt.

As described above, the element included in at least one of the first electrode 41 and the second electrode 42 can be injected into the boundary portion 15 as a conductive element M. In this case, the first electrode 41 and the second electrode 42 are preferably made of at least one of Ag and Cu, which are likely to serve as the conductive element M.

Here, the first electrode 41 and the second electrode 42 may be made of different materials, or may be based on different configurations (configurations of the monolayer film or the stacked film).

The thickness of the first insulating layer 10 and the second insulating layer 20 can be set to e.g. 1-200 nm (nanometers). The thickness thinner than 1 nm is likely to make it difficult to form a uniform film. The thickness thicker than 200 nm decreases the productivity in the film formation process and the electrode formation process. Furthermore, in order to increase the efficiency of film formation and various processing steps, it is more preferable that the thickness of the first insulating layer 10 and the second insulating layer 20 is set to e.g. 1-10 nm.

In the configuration in which the first electrode 41 and the second electrode 42 penetrate through the second insulating layer 20 to the boundary portion 15, the manufacturing is facilitated by relatively thinning the thickness of the second insulating layer 20. In this case, the thickness of the second insulating layer 20 is set to e.g. 1-5 nm. Furthermore, in this case, the manufacturing is facilitated by forming the second insulating layer 20 from a material with higher processability than the first insulating layer 10.

However, as described later, it is also possible to use a configuration in which the first electrode 41 and the second electrode 42 are provided on a side surface of the first insulating layer 10 and the second insulating layer 20 without penetrating through the second insulating layer 20. In this case, the above preferable conditions regarding the thickness and processability of the second insulating layer 20 are not necessarily required.

The spacing between the first electrode 41 and the second electrode 42 is set to e.g. 10-100 nm. The spacing shorter than 10 nm makes processing difficult. The spacing longer than 100 nm decreases the memory density of the nonvolatile memory device. As this spacing becomes shorter, the operating voltage of the nonvolatile memory device can be decreased, and the power consumption can be reduced. For instance, the spacing between the first electrode 41 and the second electrode 42 is set to the minimum feature width.

Figure 6:
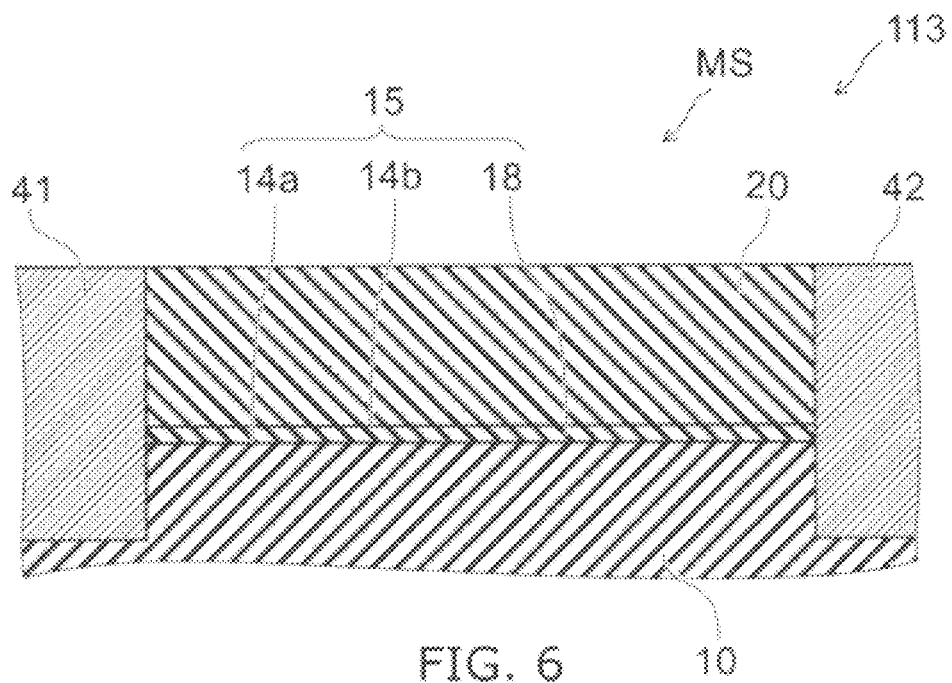
FIG. 6 is a schematic sectional view showing another nonvolatile memory device according to the first embodiment.

FIG. 6 is a schematic sectional view illustrating the configuration of another nonvolatile memory device according to the first embodiment.

As shown in FIG. 6, in the another nonvolatile memory device 113 according to the embodiment, an extremely thin (e.g., 1 nm or less) interface layer 18 is formed between the first insulating layer 10 and the second insulating layer 20. This interface layer 18 is formed by e.g. reaction of the first insulating layer 10 and the second insulating layer 20 in the boundary portion 15 by heat treatment in forming the second insulating layer 20 after forming the first insulating layer 10, or after forming the second insulating layer 20. In the case where this interface layer 18 is easily distinguished from the first insulating layer 10 and the second insulating layer 20, a sub-interface 14*a* is formed between this interface layer 18 and the first insulating layer 10, and a sub-interface 14*b* is formed between the interface layer 18 and the second insulating layer 20. Here, because the interface layer 18 is very thin, the sub-interface 14*a* and the sub-interface 14*b* are very close to each other. For instance, part of them may be in contact with each other. In the case where the thin interface layer 18 is thus formed, it is assumed that the sub-interface 14*a*, the sub-interface 14*b*, and the interface layer 18 are included in the boundary portion 15.

In the case where this interface layer 18 is not easily distinguished from the first insulating layer 10 and the second insulating layer 20, the interface layer 18 is regarded as part of the first insulating layer 10 or the second insulating layer 20. Also in this case, the boundary portion 15 includes the interface layer 18 and the interface between the first insulating layer 10 and the second insulating layer 20.

Figure 7:
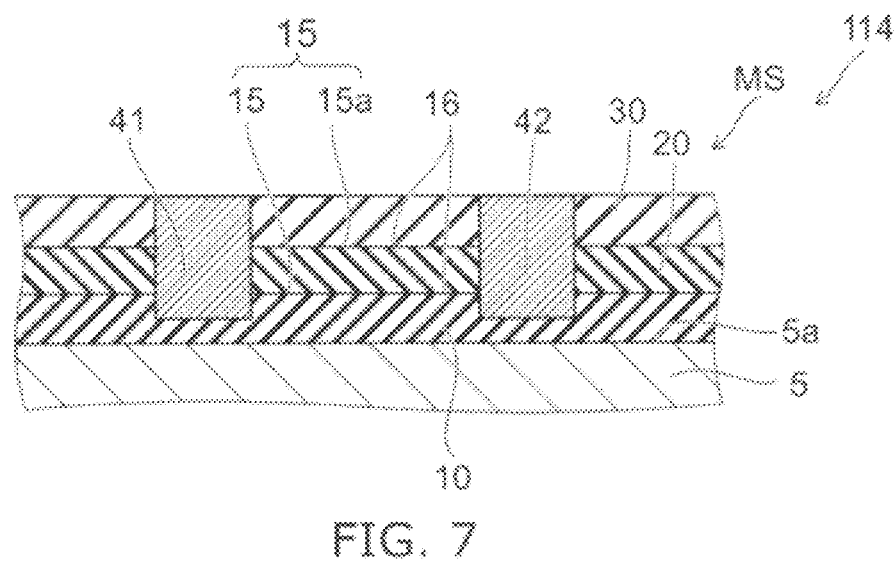
FIG. 7 is a schematic sectional view showing another nonvolatile memory device according to the first embodiment.

FIG. 7 is a schematic sectional view illustrating the configuration of another nonvolatile memory device according to the first embodiment.

As shown in FIG. 7, the memory section MS of a nonvolatile memory device 114 of a variation is different from the memory section MS of the nonvolatile memory device 110 in further including a third insulating layer 30 provided on the second insulating layer 20. The third insulating layer 30 is different from the second insulating layer 20 in at least one of composition and phase state. A boundary portion 15*a* between the second insulating layer 20 and the third insulating layer 30 is further formed.

Here, the third insulating layer 30 may be the same as the first insulating layer 10 in at least one of composition and phase state.

The nonvolatile memory device 114 can be formed as follows. After the formation of the first insulating layer 10 and the second insulating layer 20 described with reference to FIGS. 3A and 3B, the third insulating layer 30 is further formed on the second insulating layer 20. Subsequently, the processing described with reference to FIGS. 3C to 3E is performed.

In the nonvolatile memory device 114, the boundary portion 15 and the boundary portion 15*a* constitute the current path 16. In the current path 16 of the boundary portion 15 and the boundary portion 15*a* thus stacked, operations based on mechanisms similar to those described above are performed, and similar effects are achieved.

In the specific example, the number of insulating layers is three. However, the embodiment is not limited thereto. The number of stacked insulating layers may be four or more. The number of stacked insulating layers is arbitrary as long as the adjacent insulating layers are different in at least one of composition and phase state. It is only necessary that a pair of electrodes be electrically connected to the boundary portion therebetween to allow a current to flow in the boundary portion so that the electrical resistance of the current path of the boundary portion can be changed by the application voltage.

Figure 8A:
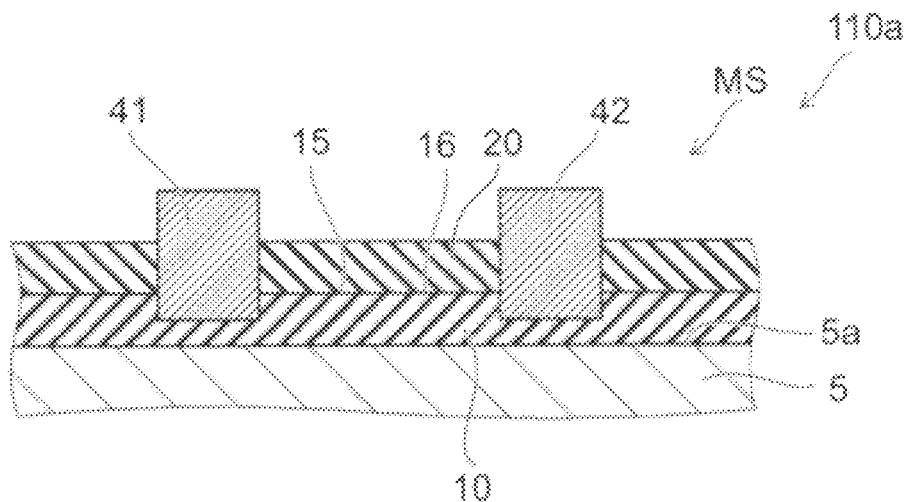
FIGS. 8A and 8B are schematic sectional views showing other nonvolatile memory devices according to the first embodiment.
Figure 8B:
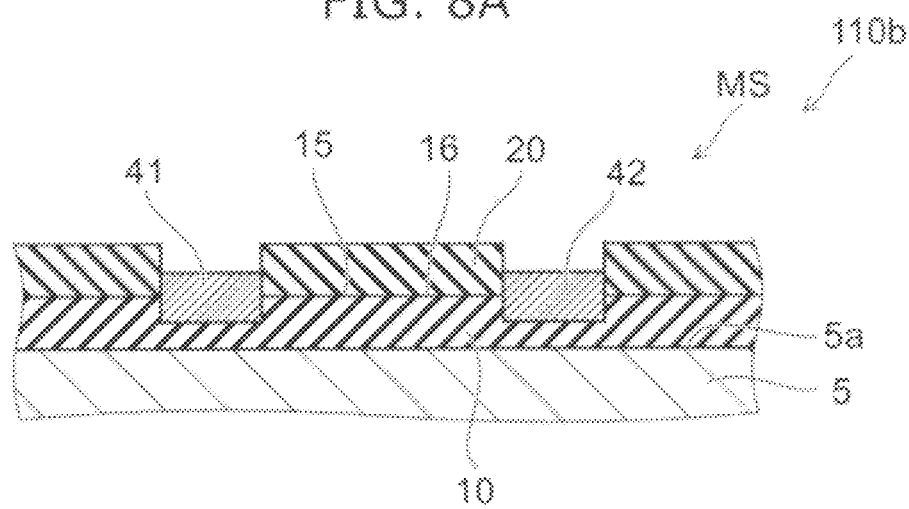

FIGS. 8A and 8B are schematic sectional views illustrating the configuration of other nonvolatile memory devices according to the first embodiment.

As shown in FIG. 8A, in a nonvolatile memory device 110*a* of a variation, the first electrode 41 and the second electrode 42 protrude from the second insulating layer 20.

As shown in FIG. 8B, in a nonvolatile memory device 110*b* of another variation, the first electrode 41 and the second electrode 42 are set back from the upper surface of the second insulating layer 20.

Here, the first electrode 41 and the second electrode 42 may be different in the height (e.g., distance from the major surface 5*a*) of the upper end.

FIGS. 9A to 9D are schematic plan views illustrating the configuration of other nonvolatile memory devices according to the first embodiment.

That is, these figures are plan views as viewed in the direction perpendicular to the major surface 5*a* of the substrate 5.

Figure 9A:
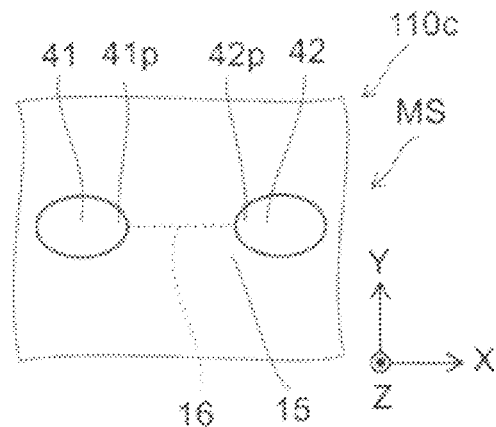
FIG. 9A to FIG. 9D are schematic plan views showing other nonvolatile memory devices according to the first embodiment.

As shown in FIG. 9A, in a nonvolatile memory device 110*c* of a variation, the cross-sectional shape (the shape of the cross section cut along a plane parallel to the major surface 5*a*) of the first electrode 41 and the second electrode 42 is a flat circle. The long axis direction of the flat circle is parallel to the direction connecting the center of the first electrode 41 and the center of the second electrode 42 (in the specific example, X-axis direction). In the first electrode 41 and the second electrode 42, the portions where the first electrode 41 and the second electrode 42 face each other protrude like circular arcs. These portions constitute a first protrusion 41*p* and a second protrusion 42*p*. In the embodiment, the short axis direction of the flat circle may be parallel to the direction connecting the first electrode 41 and the second electrode 42.

Figure 9B:
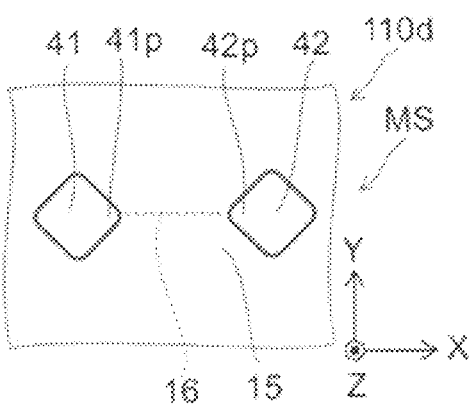

As shown in FIG. 9B, in a nonvolatile memory device 110*d* of another variation, the cross-sectional shape of the first electrode 41 and the second electrode 42 is generally a quadrangle. The direction connecting the facing vertices of the quadrangle is parallel or orthogonal to the X-axis direction. In this case, the facing vertices of the first electrode 41 and the second electrode 42 constitute the first protrusion 41*p* and the second protrusion 42*p*.

Figure 9C:
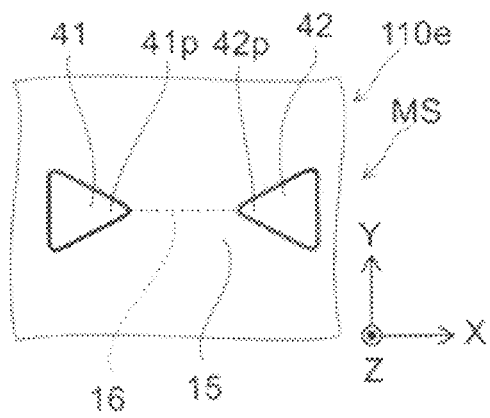

As shown in FIG. 9C, in a nonvolatile memory device 110*e* of another variation, the cross-sectional shape of the first electrode 41 and the second electrode 42 is generally a triangle. One vertex of the triangle of the first electrode 41 and one vertex of the triangle of the second electrode 42 are arranged closest to each other. These vertices constitute the first protrusion 41*p* and the second protrusion 42*p*.

As in the above nonvolatile memory devices 110*c*-110*e*, the first electrode 41 and the second electrode 42 include the first protrusion 41*p* and the second protrusion 42*p*, respectively. Thus, an electric field concentration portion can be effectively formed, and the current path 16 is formed in this electric field concentration portion. This further improves the controllability of the current path 16.

Here, the embodiment is not limited thereto, but the cross-sectional shape of the first electrode 41 and the second electrode 42 is arbitrary.

Figure 9D:
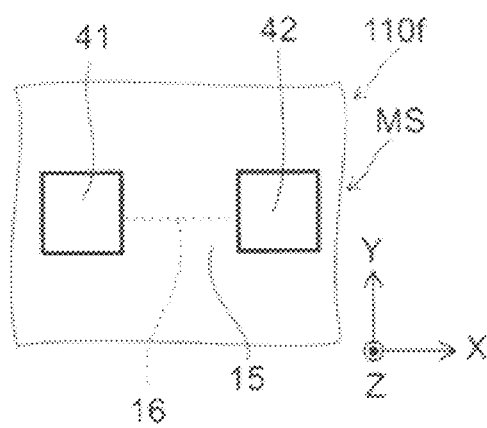

For instance, as illustrated in FIG. 9D, in a nonvolatile memory device 110f of another variation, the cross-sectional shape of the first electrode 41 and the second electrode 42 is generally a rectangle. The side of the rectangle of the first electrode 41 facing the second electrode 42, and the side of the rectangle of the second electrode 42 facing the first electrode 41, are perpendicular to the X-axis direction. In this case, the degree of electric field concentration is lower than in the nonvolatile memory devices 110c-110e. However, the electric field is maximized in the central portion of the region where the first electrode 41 and the second electrode 42 face each other. Hence, the current path 16 is formed in this portion.

Thus, in the embodiment, the shape of the pair of electrodes is arbitrary. However, as described above, it is more preferable that at least one of the pair of electrodes includes a protrusion (at least one of the first protrusion 41p and the second protrusion 42p) protruding toward the other of the pair of electrodes, because an electric field concentration portion can then be formed more effectively.

Figure 10:
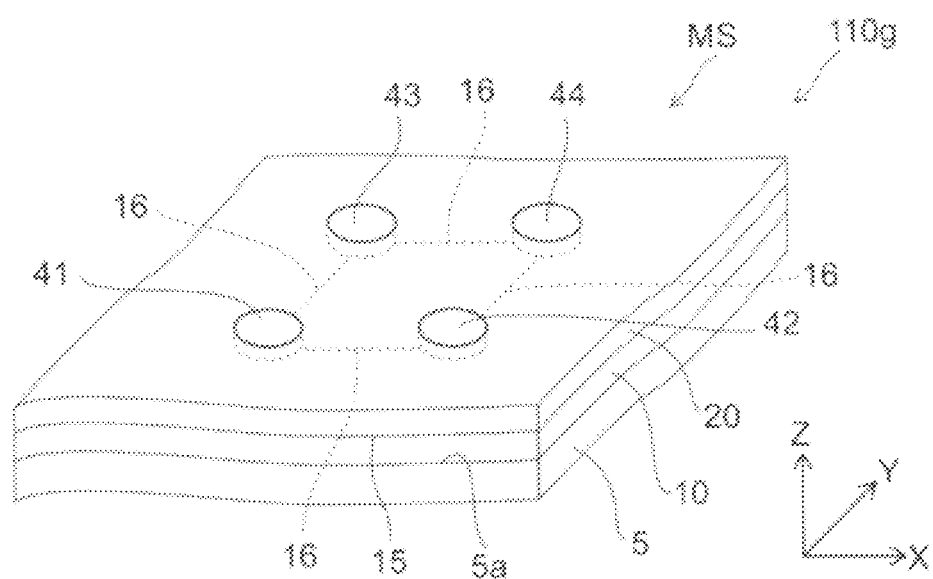
FIG. 10 is a schematic perspective view showing another nonvolatile memory device according to the first embodiment.

FIG. 10 is a schematic perspective view illustrating the configuration of another nonvolatile memory device according to the first embodiment.

As shown in FIG. 10, the memory section MS of a nonvolatile memory device 110g of another variation is different from the memory section MS of the nonvolatile memory device 110 in further including a third electrode 43 and a fourth electrode 44. Thus, in the continuous first insulating layer 10 and second insulating layer 20, it is also possible to provide three or more electrodes.

For instance, four electrodes can be equally spaced in a matrix configuration. In this case, the current path 16 formed between the closest electrodes can be used for memory operation. More specifically, current paths 16 are formed between the first electrode 41 and the second electrode 42, between the third electrode 43 and the fourth electrode 44, between the first electrode 41 and the third electrode 43, and between the second electrode 42 and the fourth electrode 44, and can be used for memory operation. Furthermore, for instance, it is also possible to use the current paths formed on the diagonals between the first electrode 41 and the fourth electrode 44, and between the second electrode 42 and the third electrode 43.

Furthermore, the spacings between the four electrodes may be changed appropriately. For instance, the spacing between the first electrode 41 and the second electrode 42, and the spacing between the third electrode 43 and the fourth electrode 44, can be made larger than the spacing between the first electrode 41 and the third electrode 43, and the spacing between the second electrode 42 and the fourth electrode 44. Thus, the flow of current can be concentrated between the first electrode 41 and the second electrode 42, and between the third electrode 43 and the fourth electrode 44. The current paths 16 therebetween can be efficiently used for memory operation.

Figure 11A:
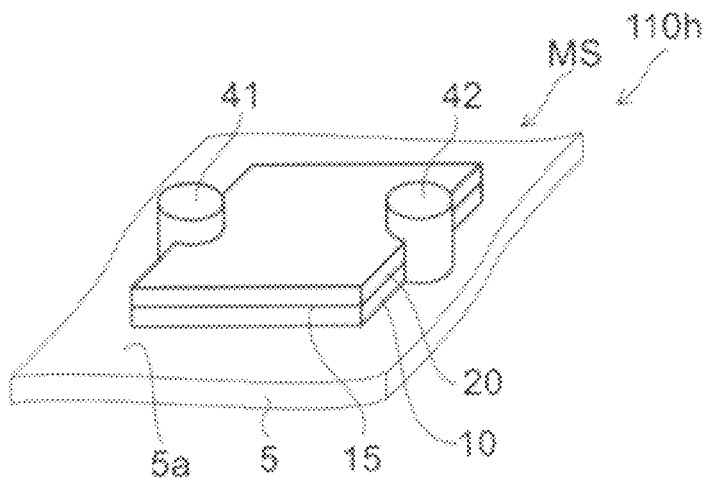
FIG. 11A to FIG. 11C are schematic perspective views showing other nonvolatile memory devices according to the first embodiment.
Figure 11B:
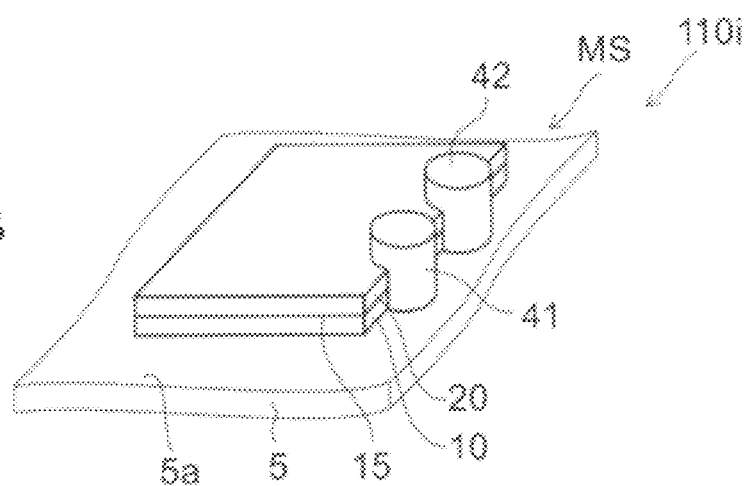
Figure 11C:
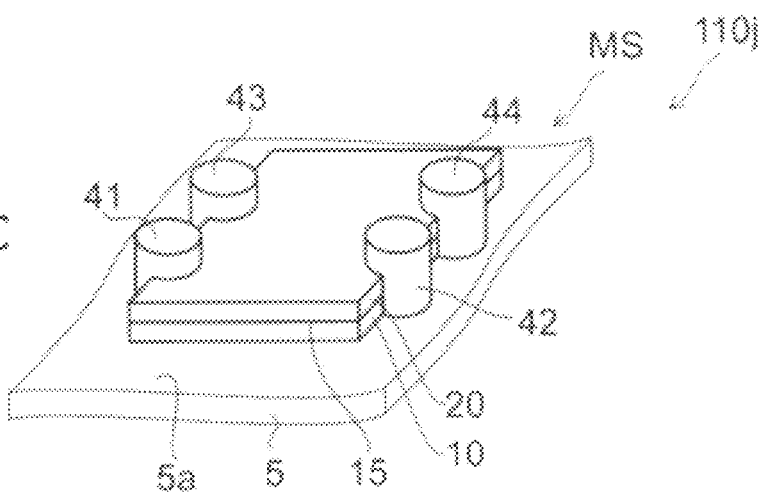
Figure 12A:
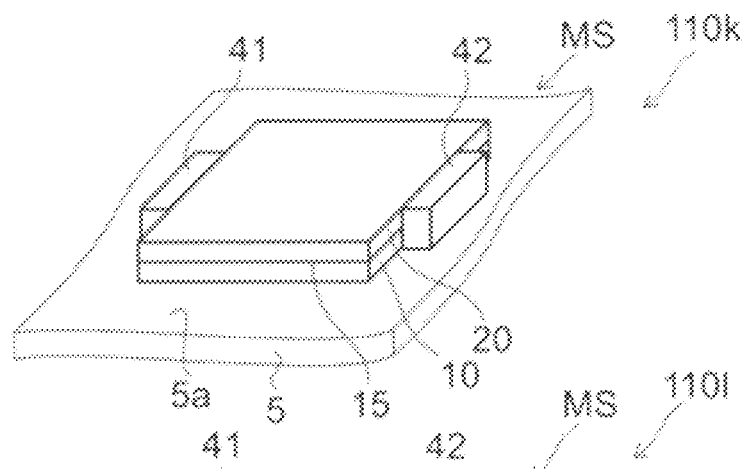
FIG. 12A to FIG. 12D are schematic perspective views showing other nonvolatile memory devices according to the first embodiment.
Figure 12B:
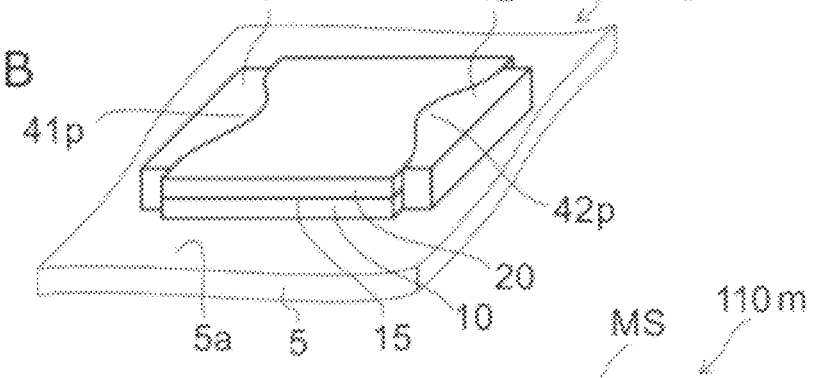
Figure 12C:
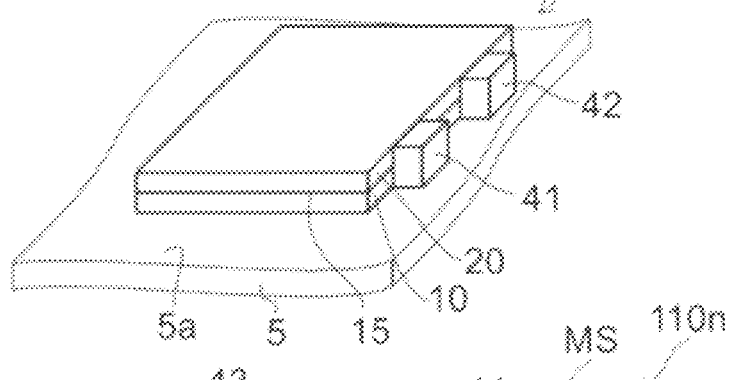
Figure 12D:
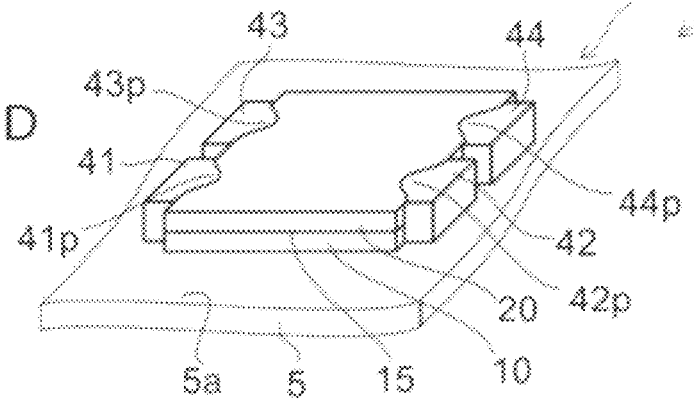

FIGS. 11A to 11C are schematic perspective views illustrating the configuration of other nonvolatile memory devices according to the first embodiment.

As shown in FIGS. 11A to 11C, in nonvolatile memory devices 110h-110j of another variation, the first electrode 41 and the second electrode 42 are provided at an end portion of the first insulating layer 10 and the second insulating layer 20. Such an end portion can be formed by processing the second insulating layer 20 and the first insulating layer 10 into a prescribed shape after e.g. the process illustrated in FIG. 3B, or after e.g. the process illustrated in FIG. 3E.

In the nonvolatile memory device 110h, the first electrode 41 is provided at one end portion of the first insulating layer 10 and the second insulating layer 20. The second electrode 42 is provided at another end portion of the first insulating layer 10 and the second insulating layer 20. In the specific example, these end portions are end portions on the sides facing each other. However, these end portions may be end portions on the sides adjacent to each other.

In the nonvolatile memory device 110i, the first electrode 41 and the second electrode 42 are provided at the same end portion of the first insulating layer 10 and the second insulating layer 20 and spaced from each other.

In the nonvolatile memory device 110j, the third electrode 43 and the fourth electrode 44 are further provided at an end portion of the first insulating layer 10 and the second insulating layer 20. Also in this case, operations similar to those described with reference to the nonvolatile memory device 110g can be performed.

FIGS. 12A to 12D are schematic perspective views illustrating the configuration of other nonvolatile memory devices according to the first embodiment.

As shown in FIGS. 12A to 12D, in nonvolatile memory devices 110k-110n of another variation, the first electrode 41 and the second electrode 42 are provided on the side surface of the first insulating layer 10 and the second insulating layer 20. That is, the first electrode 41 and the second electrode 42 are in contact with the boundary portion 15 on the side surface of the first insulating layer 10 and the second insulating layer 20.

In the nonvolatile memory device 110k, the first electrode 41 is provided on one side surface of the first insulating layer 10 and the second insulating layer 20. The second electrode 42 is provided on another side surface of the first insulating layer 10 and the second insulating layer 20. In the specific example, these side surfaces are side surfaces on the sides facing each other. However, these side surfaces may be side surfaces on the sides adjacent to each other.

In the nonvolatile memory device 110l, the side surfaces of the first insulating layer 10 and the second insulating layer 20 are shaped like inward concave curved surfaces. The first electrode 41 is provided on one of the side surfaces, and the second electrode 42 is provided on the other of the side surfaces. Thus, by shaping the side surfaces of the first insulating layer 10 and the second insulating layer 20 like inward concave curved surfaces, the first electrode 41 and the second electrode 42 include facing protrusions (first protrusion 41p and second protrusion 42p). An electric field concentration portion is formed at these protrusions. Thus, the current path 16 is controlled more efficiently.

In the nonvolatile memory device 110m, the first electrode 41 and the second electrode 42 are provided on the same side surface of the first insulating layer 10 and the second insulating layer 20 and spaced from each other.

In the nonvolatile memory device 110n, the third electrode 43 and the fourth electrode 44 are further provided on the side surface of the first insulating layer 10 and the second insulating layer 20. In the specific example, the side surfaces of the first insulating layer 10 and the second insulating layer 20 are shaped like inward concave curved surfaces. The first to fourth electrodes 41-44 include protrusions (first to fourth protrusions 41p-44p).

Thus, the configuration of electrodes for passing a current along the boundary portion 15 can be variously modified.

Here, the configuration of electrodes described with reference to the nonvolatile memory devices 110a-110n is also applicable to the nonvolatile memory devices 111-114.

Second Embodiment

Figure 13:
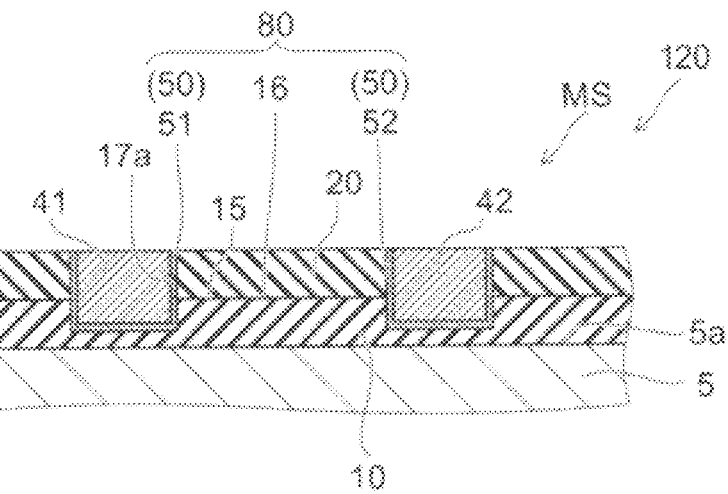
FIG. 13 is a schematic sectional view showing a nonvolatile memory device according to a second embodiment.

FIG. 13 is a schematic sectional view illustrating the configuration of a nonvolatile memory device according to a second embodiment.

As shown in FIG. 13, the nonvolatile memory device 120 according to the second embodiment further includes a first intermediate layer 51 and a second intermediate layer 52 (intermediate layer 50) between the first electrode 41 and the boundary portion 15, and between the second electrode 42 and the boundary portion 15. The remaining configuration (first insulating layer 10, second insulating layer 20, first electrode 41, second electrode 42, and substrate 5) can be based on the material and configuration described with reference to the nonvolatile memory device 110, and hence the description thereof is omitted.

Here, this intermediate layer 50 only needs to be provided between the boundary portion 15 and at least one of the first electrode 41 and the second electrode 42. That is, it is also possible to provide only one of the first intermediate layer 51 and the second intermediate layer 52. In other words, the memory section MS of the nonvolatile memory device 120 further includes the intermediate layer 50 (at least one of the first intermediate layer 51 and the second intermediate layer 52) provided between the boundary portion 15 and at least one of a pair of electrodes.

In the specific example, the first intermediate layer 51 is provided along the surface of the first electrode 41 facing the first insulating layer 10 and the second insulating layer 20. The second intermediate layer 52 is provided along the surface of the second electrode 42 facing the first insulating layer 10 and the second insulating layer 20. However, the embodiment is not limited thereto. The first intermediate layer 51 and the second intermediate layer 52 only need to be provided at least between the boundary portion 15 and the portion of the first electrode 41 and the second electrode 42 where the first electrode 41 and the second electrode 42 are faced to each other.

This intermediate layer 50 is made of a material whose electrical resistance is changed by application of voltage. Specifically, examples of this material can include $TiO_2$, NiO, $ZrO_2$, $HfO_2$, PrCaMnO, and $Al_2O_3$. However, this material is not limited thereto. For instance, the intermediate layer 50 can be made of an oxide including one selected from the first group and the second group described above.

This intermediate layer 50 has a lower electrical resistance than the first insulating layer 10 and the second insulating layer 20. The current flowing between the first electrode 41 and the second electrode 42 flows in the boundary portion 15 and the intermediate layer 50. That is, the current path 16 includes the boundary portion 15 and the portion of the intermediate layer 50 where the current is passed. The portion of the intermediate layer 50 where the current is passed is at least one of the portion of the first intermediate layer 51 sandwiched between the first electrode 41 and the boundary portion 15, and the portion of the second intermediate layer 52 sandwiched between the second electrode 42 and the boundary portion 15.

The nonvolatile memory device 120 thus configured is based on a third one of the mechanisms in which the electrical resistance of the current path 16 changes (third mechanism).

More specifically, by the current flowing in the boundary portion 15 and the intermediate layer 50, at least part of the intermediate layer 50 serves as a reaction portion 17a where at least one of oxidation reaction and reduction reaction occurs. The electrical resistance of the current path 16 changes based on the reaction in this reaction portion 17a caused by the voltage applied between the first electrode 41 and the second electrode 42.

In the nonvolatile memory device 120, the resistance change portion 80 is formed in the intermediate layer 50. Hence, resistance change in the boundary portion 15 is not necessarily required. Thus, the boundary portion 15 only needs the formation of the current path 16 therein. Hence, for instance, the first insulating layer 10 and the second insulating layer 20 do not necessarily need to be made of a transition metal oxide exhibiting resistance change characteristics. For instance, the first insulating layer 10 and the second insulating layer 20 only need to be different in at least one of composition and phase state.

The first embodiment and the second embodiment can be practiced in combination. For instance, two or three of the first to third mechanisms may be used in combination.

For instance, the nonvolatile memory device can include the first insulating layer 10, and the second insulating layer 20 different from the first insulating layer 10 in at least one of composition and phase state. At least one of the first insulating layer 10 and the second insulating layer 20 includes a transition metal compound. Thus, the first mechanism for forming the reaction portion 17 in the boundary portion 15 is used. At the same time, the nonvolatile memory device may be based on the second mechanism in which the high concentration region MA of the conductive element M (e.g., an element included in the electrode) unevenly distributed in the boundary portion is changed by the application voltage. At the same time, the intermediate layer 50 may be further provided so that the reaction portion 17a is provided in the intermediate layer 50 to use the third mechanism.

Also in the nonvolatile memory device 120 in which the memory layer MS further includes the intermediate layer 50 and uses the third mechanism, the configuration of the first electrode 41 and the second electrode 42 can be variously modified. Various configurations for electrodes described with reference to the nonvolatile memory devices 110a-110n are also applicable to the nonvolatile memory device 120.

In the following, an example method for manufacturing the nonvolatile memory device 120 is described.

Figure 14:
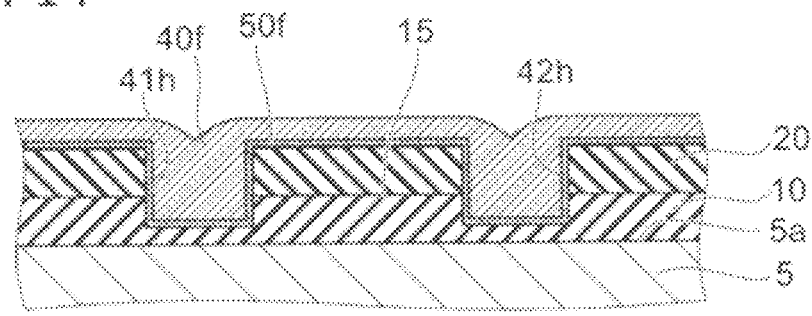
FIG. 14 is a schematic sectional view showing a method for manufacturing the nonvolatile memory device.

FIG. 14 is a schematic sectional view illustrating a method for manufacturing the nonvolatile memory device according to the second embodiment.

First, in a similar manner to that described with reference to FIGS. 3A to 3C, the first insulating layer 10 is formed on the major surface 5a of the substrate 5. The second insulating layer 20 is formed on the first insulating layer 10. The contact holes 41h and 42h penetrating through the second insulating layer 20 to the first insulating layer 10 are formed.

Next, as shown in FIG. 14, first, an intermediate layer film 50f constituting the intermediate layer 50 is formed on the second insulating layer 20 and inside the contact holes 41h and 42h. The conductive film 40f constituting the first electrode 41 and the second electrode 42 is formed on the intermediate layer film 50f.

The intermediate layer film 50f is e.g. a monolayer film made of one selected from the first group and the second group, or a stacked film made of a plurality selected therefrom. The conductive film 40f is a monolayer film made of one selected from the fourth group described above, or a stacked film made of a plurality selected therefrom.

Subsequently, for instance, in a similar manner to that described with reference to FIG. 3E, by planarization, the second insulating layer 20 is exposed. Thus, the intermediate layer film 50f and the conductive film 40f are separated to form the first intermediate layer 51 and the second intermediate layer 52, and the first electrode 41 and the second electrode 42.

Thus, the nonvolatile memory device 120 illustrated in FIG. 13 can be formed.

The process of forming the first intermediate layer 51 and the second intermediate layer 52, and the first electrode 41 and the second electrode 42 is arbitrary.

Also in this case, the conductive element M may be unevenly distributed in the boundary portion 15.

Furthermore, various types of heat treatment may be performed. Thus, the state of at least one of the region between the boundary portion 15 and the first electrode 41, and the region between the boundary portion 15 and the second electrode 42 can be placed in a desired state. Furthermore, the conductive element M can be unevenly distributed in the boundary portion 15. Furthermore, the conductive element M can be introduced from the first electrode 41 and the second electrode 42 via the intermediate layer 50 into the boundary portion 15.

Here, the desired state refers to a desired state regarding characteristics including the condition of the forming process (e.g., including the value of the voltage required for the forming, and also including the case where the forming process is unnecessary), the electrical resistance in the high resistance state (off-resistance), the electrical resistance in the low resistance state (on-resistance), the difference (or ratio) between the off-resistance and the on-resistance, the first transition voltage V1 (reset voltage) and the second transition voltage V2 (set voltage) for transitions between the high resistance state and the low resistance state, the difference between the first transition voltage V1 and the second transition voltage V2 (voltage margin), the retention characteristics and rewrite endurance indicating the stability in long-term operation, and uniformity of these characteristics among a plurality of elements.

Figure 15:
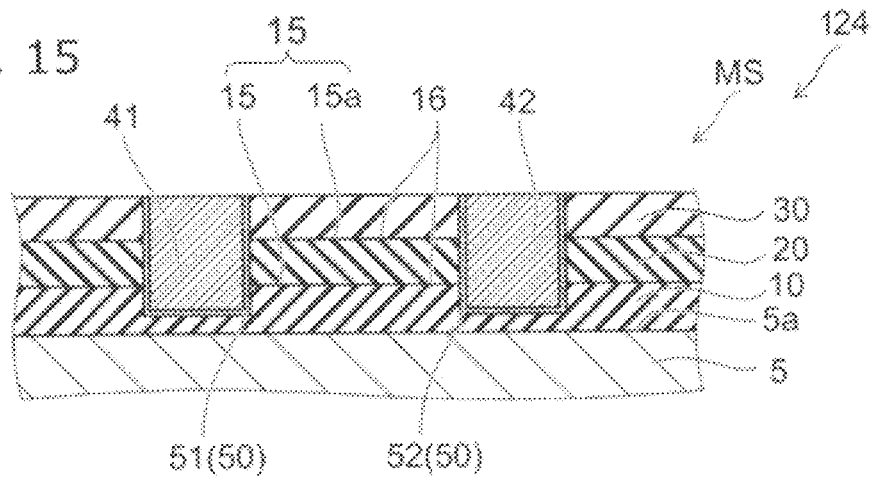
FIG. 15 is a schematic sectional view showing another nonvolatile memory device according to the second embodiment.

FIG. 15 is a schematic sectional view illustrating the configuration of another nonvolatile memory device according to the second embodiment.

As shown in FIG. 15, the memory section MS of a nonvolatile memory device 124 of a variation is different from the memory section MS of the nonvolatile memory device 120 in further including the third insulating layer 30 provided on the second insulating layer 20. The third insulating layer 30 is different from the second insulating layer 20 in at least one of composition and phase state. The boundary portion 15a between the second insulating layer 20 and the third insulating layer 30 is further formed.

Here, also in this case, the third insulating layer 30 may be the same as the first insulating layer 10 in at least one of composition and phase state.

The nonvolatile memory device 124 can be formed as follows. For instance, after the formation of the first insulating layer 10 and the second insulating layer 20 described with reference to FIGS. 3A and 3B, the third insulating layer 30 is further formed on the second insulating layer 20.

Subsequently, the processing described with reference to FIGS. 3C, 14, and 3E is performed.

In the nonvolatile memory device 124, the first intermediate layer 51 (intermediate layer 50) is provided between the boundary portion 15 and the first electrode 41 and between the boundary portion 15a and the first electrode 41. Likewise, the second intermediate layer 52 (intermediate layer 50) is provided between the boundary portion 15 and the second electrode 42, and between the boundary portion 15a and the second electrode 42.

In the nonvolatile memory device 124, the boundary portion 15 and the boundary portion 15a, and the first intermediate layer 51 and the second intermediate layer 52 constitute the current path 16.

In the current path 16 of the boundary portion 15 and the boundary portion 15a, and the first intermediate layer 51 and the second intermediate layer 52 thus stacked, operations similar to those described above are performed.

In the specific example, the number of insulating layers is three. However, the embodiment is not limited thereto. The number of stacked insulating layers may be four or more. The number of stacked insulating layers is arbitrary as long as the adjacent insulating layers are different in at least one of composition and phase state. It is only necessary that an intermediate layer be provided between the boundary portion therebetween and a pair of electrodes to allow a current to flow in the boundary portion via the intermediate layer by the pair of electrodes so that the electrical resistance of the current path including the boundary portion and the intermediate layer can be changed by the application voltage.

Third Embodiment

A nonvolatile memory device according to a third embodiment is a nonvolatile memory device in which the resistance change portion 80 according to the embodiments is combined with an FET.

Figure 16:
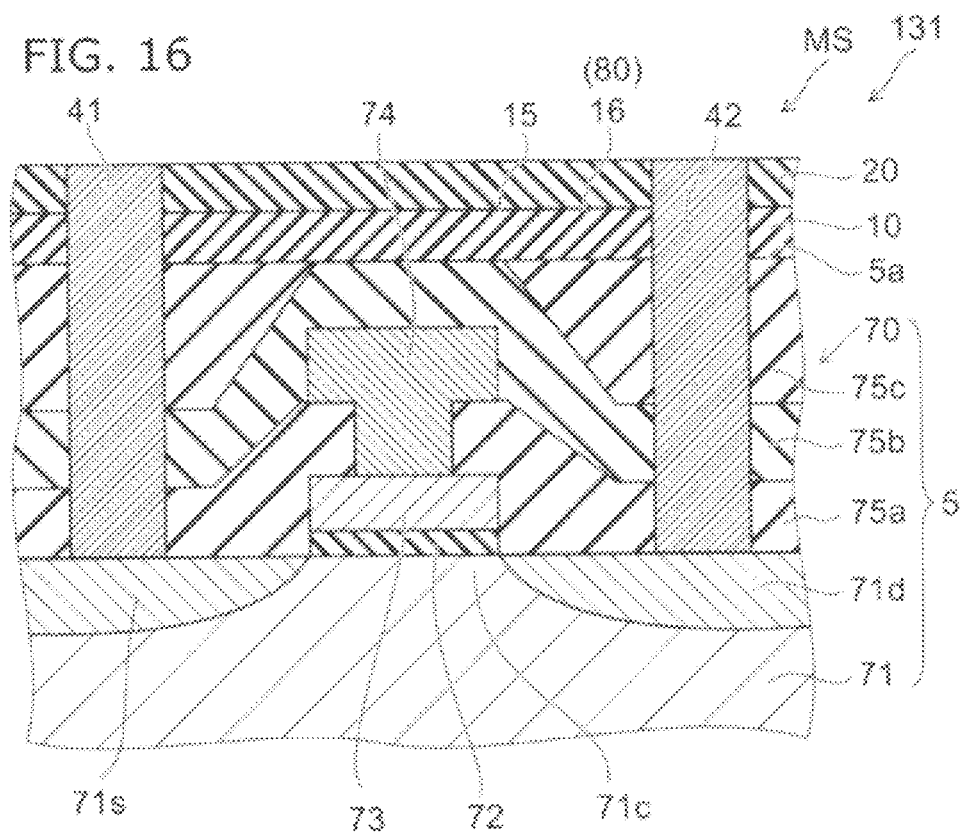
FIG. 16 is a schematic sectional view showing a nonvolatile memory device according to a third embodiment.

FIG. 16 is a schematic sectional view illustrating the configuration of a nonvolatile memory device according to the third embodiment.

Figure 17:
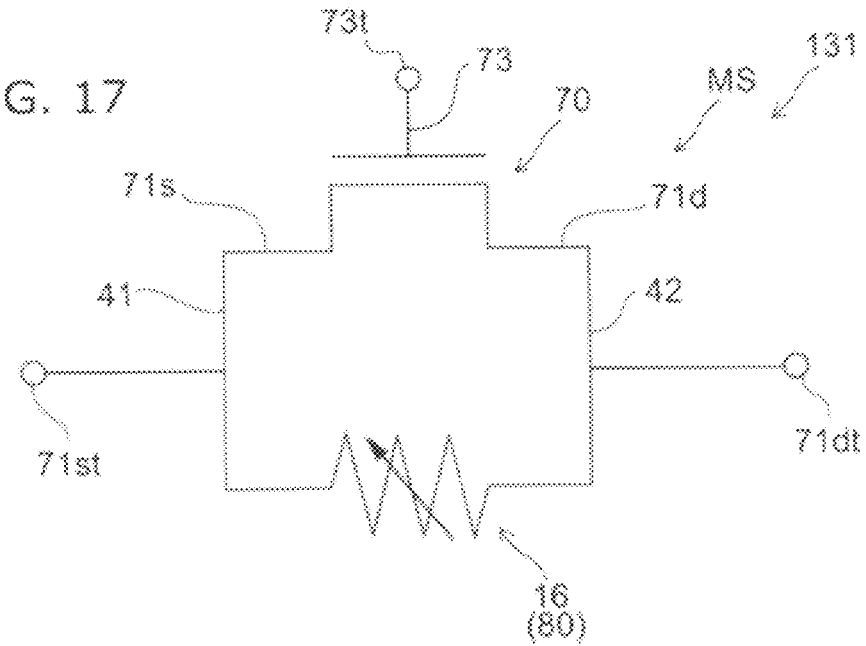
FIG. 17 is a circuit diagram showing the nonvolatile memory device.

FIG. 17 is a circuit diagram illustrating the configuration of the nonvolatile memory device according to the third embodiment.

As shown in FIG. 16, in the nonvolatile memory device 131 according to the embodiment, the substrate 5 includes an FET 70 (writing section).

The FET 70 includes a semiconductor layer 71, a gate insulating film 72, and a gate electrode 73.

The semiconductor layer 71 includes a channel region 71c, and a source region 71s and a drain region 71d provided on both sides of the channel region 71c. The gate insulating film 72 is provided on the channel region 71c. The gate electrode 73 is provided on the gate insulating film 72.

The pair of electrodes (first electrode 41 and second electrode 42) are electrically connected to the source region 71s and the drain region 71d, respectively.

In the specific example, a first interlayer insulating film 75a, a second interlayer insulating film 75b, and a third interlayer insulating film 75c are provided so as to cover the semiconductor layer 71, the gate insulating film 72, and the gate electrode 73. An opening is provided in the portion of the first interlayer insulating film 75a above the gate electrode 73. In this portion, a gate interconnect 74 is electrically connected to the gate electrode 73. Here, the first interlayer insulating film 75a, the second interlayer insulating film 75b, the third interlayer insulating film 75c, and the gate interconnect 74 are also included in the substrate 5. Here, the substrate 5 may include any other interconnects and elements.

On the major surface 5a of the substrate 5 having such a structure, the first insulating layer 10 is formed, and the second insulating layer 20 is formed thereon. The first electrode 41 and the second electrode 42 are provided so as to penetrate through the first insulating layer 10 and the second insulating layer 20 to the source region 71s and the drain region 71d, respectively. Thus, the boundary portion 15 is electrically connected to the source region 71s and the drain region 71d. In this configuration, the gate electrode 73 is disposed on the semiconductor layer 71, and the first insulating layer 10 and the second insulating layer 20 are disposed on the gate electrode 73. That is, the gate electrode 73 is disposed between the first insulating layer 10 and the semiconductor layer 71 (channel region 71c) and between the second insulating layer 20 and the semiconductor layer 71 (channel region 71c). The nonvolatile memory device 131 further includes an interlayer insulating film covering the gate electrode 73. The pair of electrodes (first electrode 41 and second electrode 42) penetrate through this interlayer insulating film along the first direction perpendicular to the major surface.

The semiconductor layer 71 can be e.g. a silicon wafer, various wells, or SOI (silicon on insulator). The gate insulating film 72 can be made of e.g. silicon oxide. The gate electrode 73 can be made of e.g. polysilicon. However, the above materials are illustrative only, and arbitrary materials can be used.

As shown in FIG. 17, the memory section MS of the nonvolatile memory device 131 thus configured has a configuration in which the FET 70 and the resistance change portion 80 are connected in parallel.

In the nonvolatile memory device 131, a prescribed voltage is applied between the first electrode 41 and the second electrode 42 to change the electrical resistance of the resistance change portion 80 (current path 16) to perform writing and erasure of information. At read time, a read voltage having a smaller absolute value than the application voltage at write time and erase time is applied between the first electrode 41 and the second electrode 42 to read the written information.

The nonvolatile memory device 131 has a configuration in which the FET 70 and the resistance change portion 80 are connected in parallel. Hence, the electrical characteristics at the first, second, and third terminals 71st, 71dt, and 73t connected to the source region 71s, the drain region 71d, and the gate electrode 73 can be changed by the electrical resistance of the resistance change portion 80. Thus, the configuration of the nonvolatile memory device 131 can also be used as a reconfigurable logic circuit.

Figure 18A:
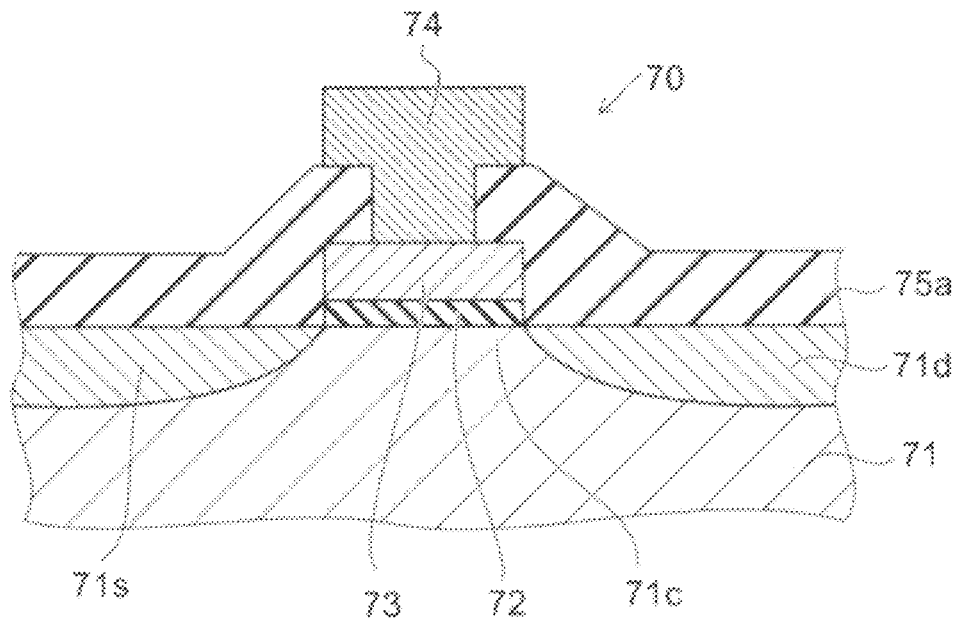
FIGS. 18A and 18B are sequential schematic sectional views showing a method for manufacturing the nonvolatile memory device.
Figure 18B:
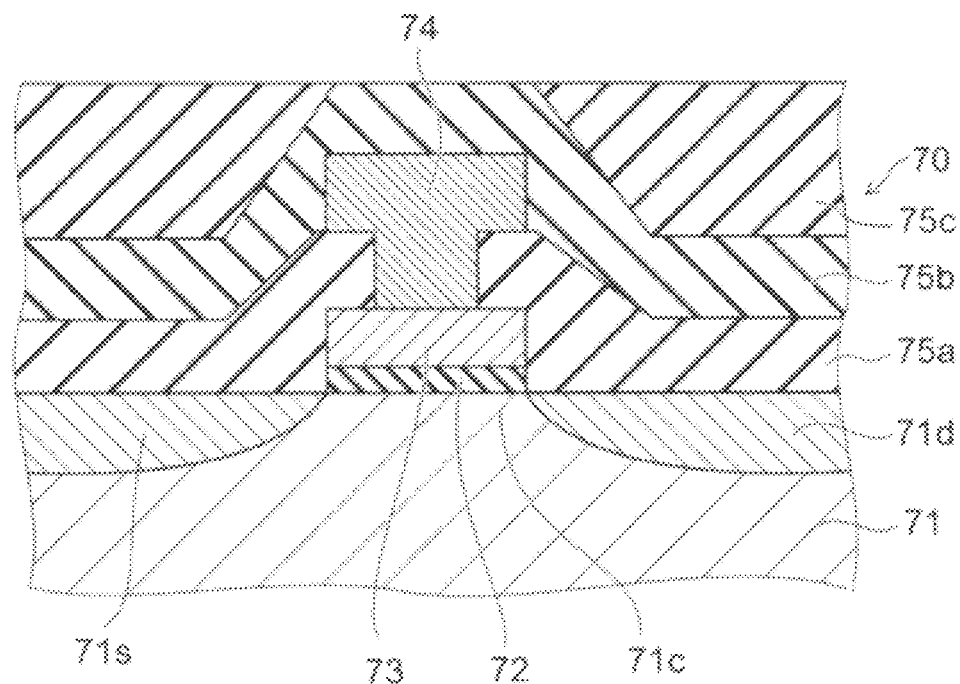

FIGS. 18A and 18B are sequential schematic sectional views illustrating a method for manufacturing the nonvolatile memory device according to the third embodiment.

Figure 19:
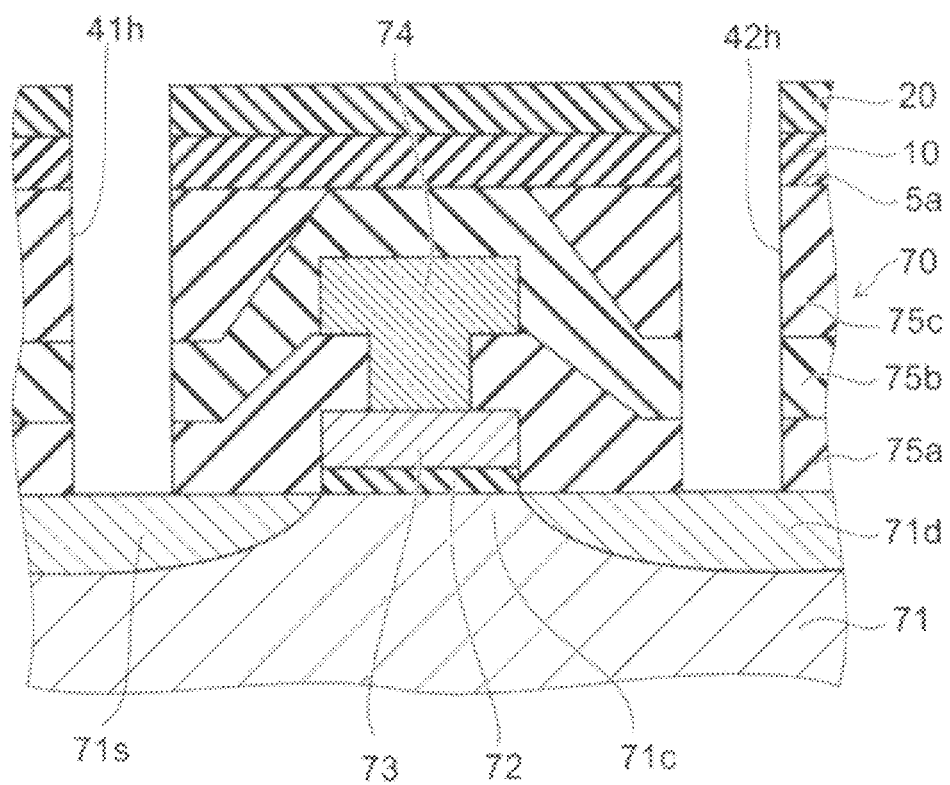
FIG. 19 is a sequential schematic sectional view subsequent to FIG. 18B.

FIG. 19 is a sequential schematic sectional view subsequent to FIG. 18B.

First, as shown in FIG. 18A, on a silicon wafer constituting the semiconductor layer 71, for instance, a silicon oxide film constituting the gate insulating film 72 is formed by thermal oxidation. A polysilicon film constituting the gate electrode 73 is formed thereon. By lithography and etching, the gate insulating film 72 and the gate electrode 73 are formed. Then, ion implantation is performed on the silicon wafer exposed from the gate insulating film 72 and the gate electrode 73. By an activation heat treatment process, impurity doping layers (source region 71s and drain region 71d) are formed. The portion of the silicon wafer between the source region 71s and the drain region 71d constitutes the channel region 71c. Thus, the FET 70 is formed. On these structures, the first interlayer insulating film 75a made of silicon oxide film is formed by e.g. the CVD method. Then, an opening is formed in the first interlayer insulating film 75a above the gate electrode 73. The gate interconnect 74 is formed so as to fill the opening.

Next, as shown in FIG. 18B, the second interlayer insulating film 75b made of silicon nitride film, and the third interlayer insulating film 75c made of silicon oxide film are sequentially formed, and planarized by e.g. the CMP method.

Here, by using the materials of the above combination for the second interlayer insulating film 75b and the third interlayer insulating film 75c, the second interlayer insulating film 75b functions as an etching stopper during the CMP process. This can prevent the gate interconnect 74 from being exposed.

Next, as shown in FIG. 19, by a method similar to that described with reference to FIGS. 3A to 3C, the first insulating layer 10 and the second insulating layer 20 are formed on the second interlayer insulating film 75b and the third interlayer insulating film 75c, and the contact holes 41h and 42h are formed. The contact holes 41h and 42h penetrate through the first insulating layer 10 and the second insulating layer 20 to the source region 71s and the drain region 71d, respectively.

Subsequently, by a method similar to that described with reference to FIGS. 3D and 3E, a conductive material is embedded in the contact holes 41h and 42h to form the first electrode 41 and the second electrode 42. Thus, the nonvolatile memory device 131 illustrated in FIG. 16 can be formed.

In the nonvolatile memory device 131, the current path 16 formed in the boundary portion 15 described above is used as the resistance change portion 80. Hence, the position and shape of the current path 16 are accurately controlled, and the characteristics are highly stable.

Figure 20:
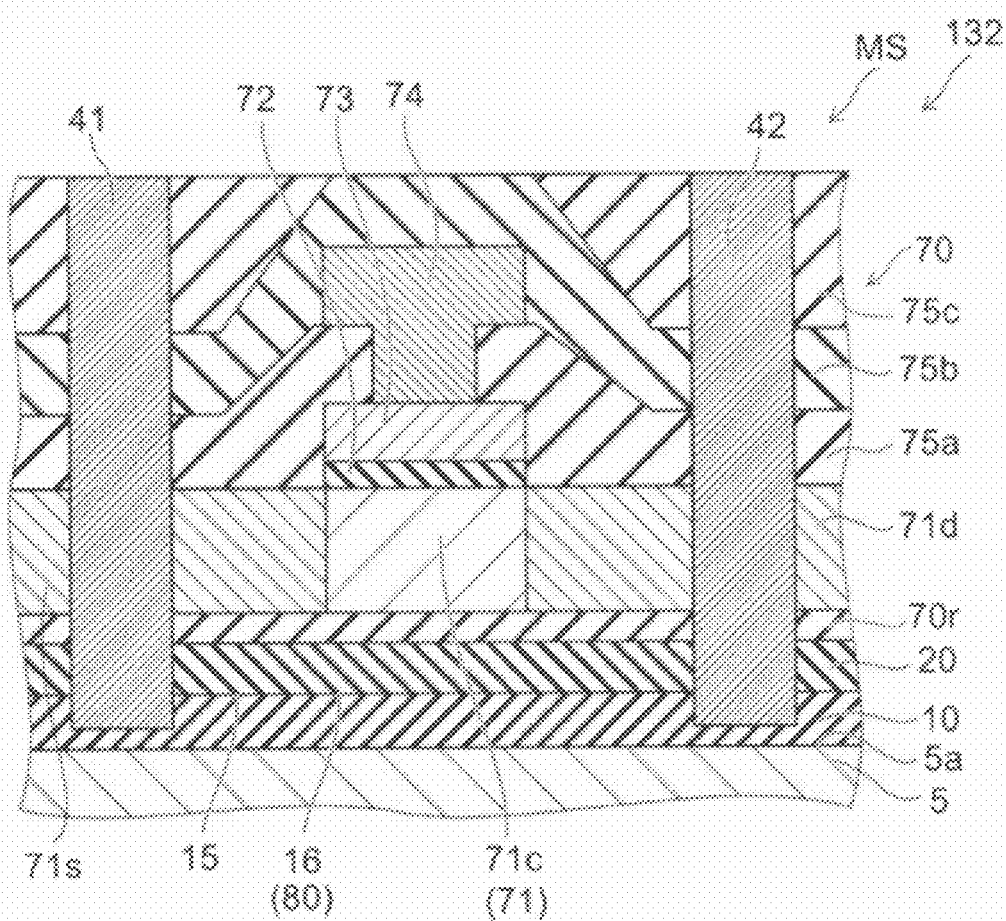
FIG. 20 is a schematic sectional view showing another nonvolatile memory device according to the third embodiment.

FIG. 20 is a schematic sectional view illustrating the configuration of another nonvolatile memory device according to the third embodiment.

As shown in FIG. 20, in the another nonvolatile memory device 132 according to the embodiment, the FET 70 is formed on the first insulating layer 10 and the second insulating layer 20 formed on the substrate 5.

That is, in addition to the memory section MS of the nonvolatile memory device 110, the memory section MS of the nonvolatile memory device 132 further includes the FET 70 provided on the second insulating layer 20.

Also in this case, the FET 70 includes the semiconductor layer 71, the gate insulating film 72, and the gate electrode 73. The semiconductor layer 71 includes the channel region 71c, and the source region 71s and the drain region 71d provided on both sides of the channel region 71c. The gate insulating film 72 is provided on the channel region 71c. The gate electrode 73 is provided on the gate insulating film 72. The specific example also includes the first interlayer insulating film 75a, the second interlayer insulating film 75b, a third interlayer insulating film 75c, and the gate interconnect 74. In this configuration, the semiconductor layer 71 (channel region 71c) is located between the first insulating layer 10 and the gate electrode 73 and between the second insulating layer 20 and the gate electrode 73. The nonvolatile memory device 132 further includes an interlayer insulating film covering the gate electrode 73. The pair of electrodes (first electrode 41 and second electrode 42) penetrate through this interlayer insulating film along the first direction perpendicular to the major surface.

Also in this case, the pair of electrodes (first electrode 41 and second electrode 42) are electrically connected to the source region 71s and the drain region 71d, respectively. That is, the first electrode 41 and the second electrode 42 penetrate through the source region 71s and the drain region 71d, respectively, and further penetrates through the second insulating layer 20 to the first insulating layer 10. Thus, the boundary portion 15 is electrically connected to the source region 71s and the drain region 71d.

The memory section MS of this nonvolatile memory device 132 also has a configuration in which the FET 70 and the resistance change portion 80 are connected in parallel.

In the specific example, a diffusion prevention layer 70r for suppressing diffusion of elements between the semiconductor layer 71 and the second insulating layer 20 is provided between the second insulating layer 20 and the semiconductor layer 71. However, this diffusion prevention layer 70r only needs to be provided as necessary, and may be omitted.

Figure 21A:
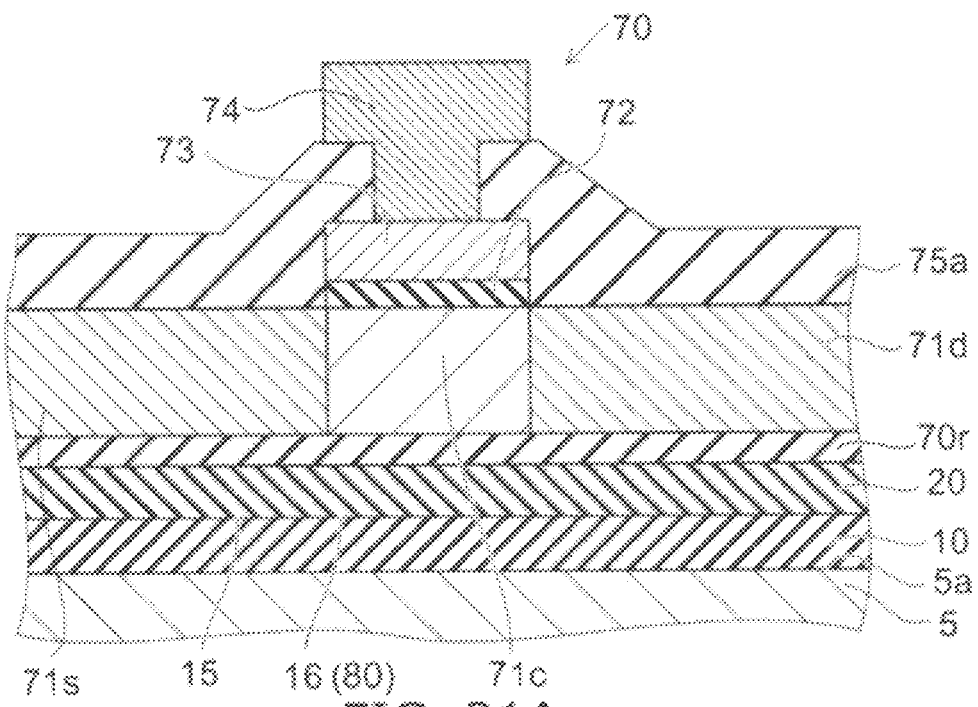
FIGS. 21A and 21B are sequential schematic sectional views showing another method for manufacturing the another nonvolatile memory device.
Figure 21B:
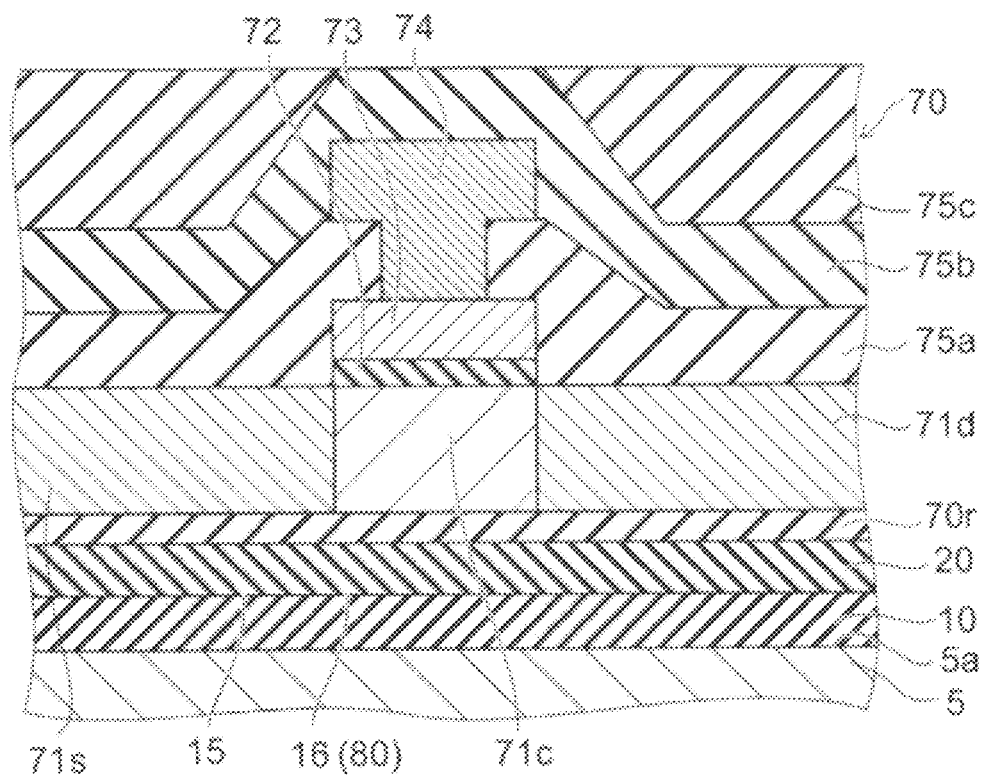

FIGS. 21A and 21B are sequential schematic sectional views illustrating another method for manufacturing the another nonvolatile memory device according to the third embodiment.

First, by a technique similar to that described with reference to FIGS. 3A and 3B, the first insulating layer 10 and the second insulating layer 20 are formed. The diffusion prevention layer 70r is formed thereon as necessary.

Then, a silicon layer constituting a semiconductor layer 71 is formed thereon by e.g. the CVD method. Furthermore, for instance, a silicon oxide film constituting the gate insulating film 72 is formed thereon by the ALD method. A polysilicon film, for instance, constituting the gate electrode 73 is formed thereon. By lithography and etching, the gate insulating film and the gate electrode 73 are formed. Then, ion implantation is performed on the silicon wafer exposed from the gate insulating film 72 and the gate electrode 73. By an activation heat treatment process, impurity doping layers (source region 71s and drain region 71d) are formed. The portion of the semiconductor layer 71 between the source region 71s and the drain region 71d constitutes the channel region 71c. Subsequently, by a method similar to that described with reference to FIG. 18A, the first interlayer insulating film 75a and the gate interconnect 74 are formed.

Next, as shown in FIG. 21B, the second interlayer insulating film 75b made of silicon nitride film, and the third interlayer insulating film 75c made of silicon oxide film are sequentially formed, and planarized by e.g. the CMP method.

Subsequently, the contact holes 41h and 42h penetrating through the third interlayer insulating film 75c, the second interlayer insulating film 75b, and the first interlayer insulating film 75a, further penetrating through the source region 71s or the drain region, and further penetrating through the second insulating layer 20 to the first insulating layer 10 are formed. In the case where the diffusion prevention layer 70r is formed, the contact holes 41h and 42h also penetrate through the diffusion prevention layer 70r.

Subsequently, by a method similar to that described with reference to FIGS. 3D and 3E, a conductive material is embedded in the contact holes 41h and 42h to form the first electrode 41 and the second electrode 42. Thus, the nonvolatile memory device 132 illustrated in FIG. 20 can be formed.

Also in the nonvolatile memory device 132, the current path 16 formed in the boundary portion 15 described above is used as the resistance change portion 80. Hence, the position and shape of the current path 16 are accurately controlled, and the characteristics are highly stable.

In the nonvolatile memory devices 131 and 132, by using the above structure, the memory section MS including a parallel structure of the FET 70 and the resistance change portion 80 can be easily formed.

A structure with a plurality of the memory sections MS like this provided on the substrate includes a plurality of FETs 70 and a plurality of resistance change portions 80 (each made of the first insulating layer 10, the second insulating layer 20, and the current path 16 therebetween). In this case, the portion between a pair of electrodes closest to each other functions as the current path 16. Hence, the first insulating layer 10 and the second insulating layer 20 may extend over different memory sections MS. Thus, there is no need for patterning the first insulating layer 10 and the second insulating layer 20. This has the advantage of high productivity.

The above nonvolatile memory devices 131 and 132 may further include the intermediate layer 50 described above. Thus, one or more of the first to third mechanisms can be implemented in combination. Furthermore, a stacked structure of a plurality of insulating layers, including the third insulating layer 30 described above, may be applied. Furthermore, various configurations of electrodes described above are also applicable.

Fourth Embodiment

Figure 22:
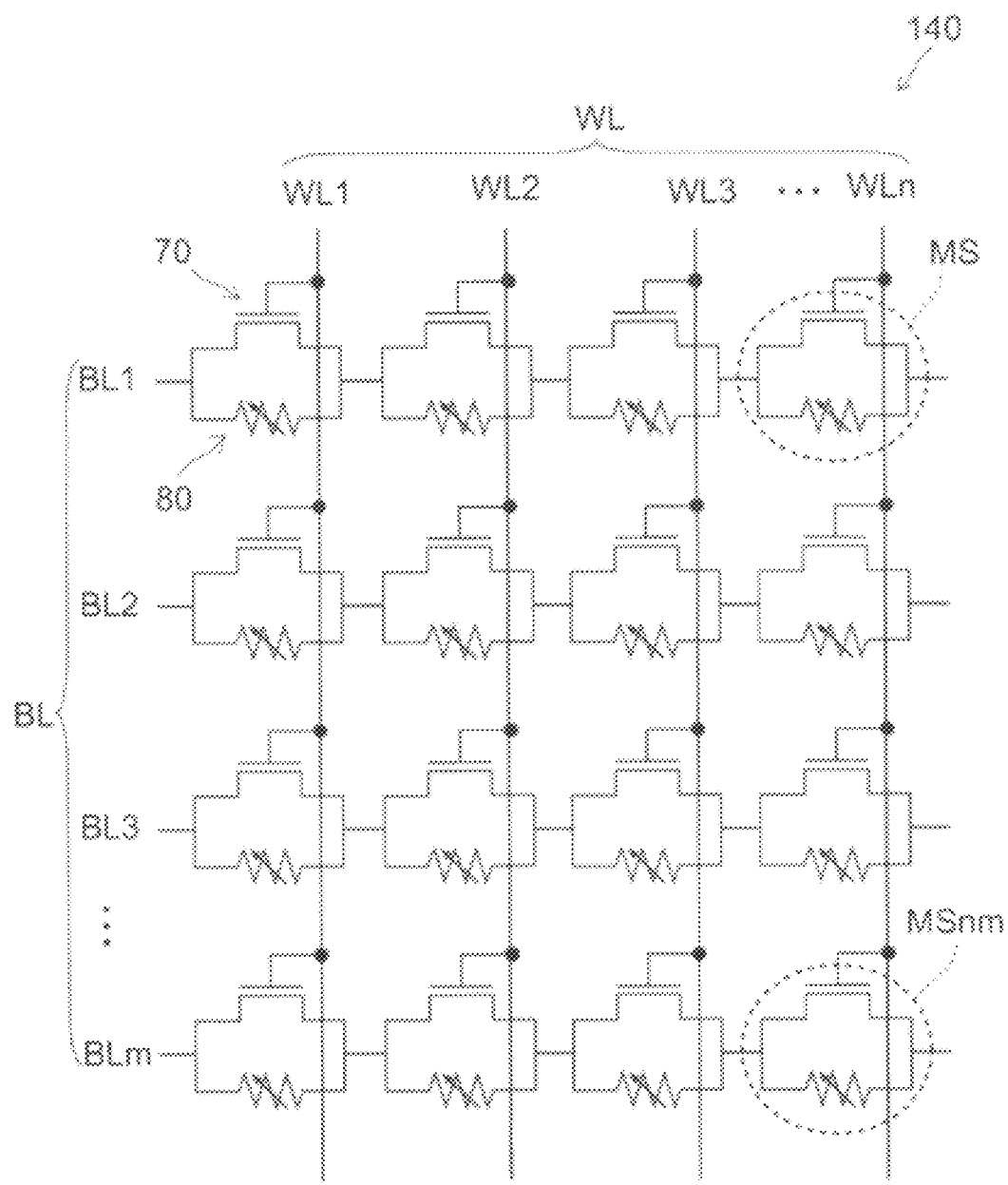
FIG. 22 is a schematic circuit diagram showing a nonvolatile memory device according to a fourth embodiment.

FIG. 22 is a schematic circuit diagram illustrating the configuration of a nonvolatile memory device according to a fourth embodiment.

As shown in FIG. 22, the nonvolatile memory device 140 according to the embodiment further includes a plurality of memory sections MS of the nonvolatile memory device according to the embodiments, a plurality of word lines WL (first interconnects) extending in the first direction parallel to the major surface 5a, and a plurality of bit lines BL (second interconnects) extending in the second direction parallel to the major surface 5a and non-parallel to the first direction. The above memory sections MS respectively correspond to facing portions of the plurality of word lines WL and the plurality of bit lines BL.

More specifically, the word lines WL include first to n-th word lines WL1-WLn. The bit lines BL include first to m-th bit lines BL1-BLm. Here, the indices n and m are integers of 2 or more. A memory section MSij is provided at the facing portion between each of the first to n-th word lines WL1-WLn and each of the first to m-th bit lines BL1-BLm. Here, i ranges from 1 to n, and j ranges from 1 to m.

The memory section MS (memory section MSij) is the memory section MS according to the embodiments described above. The memory section MS has a structure in which the resistance change portion 80 and the FET 70 are connected in parallel.

Here, for instance, the gate interconnect 74 connected to the gate electrode 73 illustrated in FIGS. 16 and 20 is used as the word line WL. The interconnect connected to the source region 71s and the drain region 71d is used as the bit line BL. Then, the source region 71s and the drain region 71d are shared by the memory sections MS adjacent in the extending direction of the bit line BL. Furthermore, the first electrode 41 and the second electrode 42 are shared by the memory sections MS adjacent in the extending direction of the bit line BL. This reduces the footprint of elements and can increase the packing density.

In the nonvolatile memory device 140 thus configured, a plurality of memory sections MS are arranged in the NAND configuration. By applying a prescribed voltage to each word line WL and each bit line BL, writing, reading, and erasure of information can be performed on each memory section MS.

Figure 23:
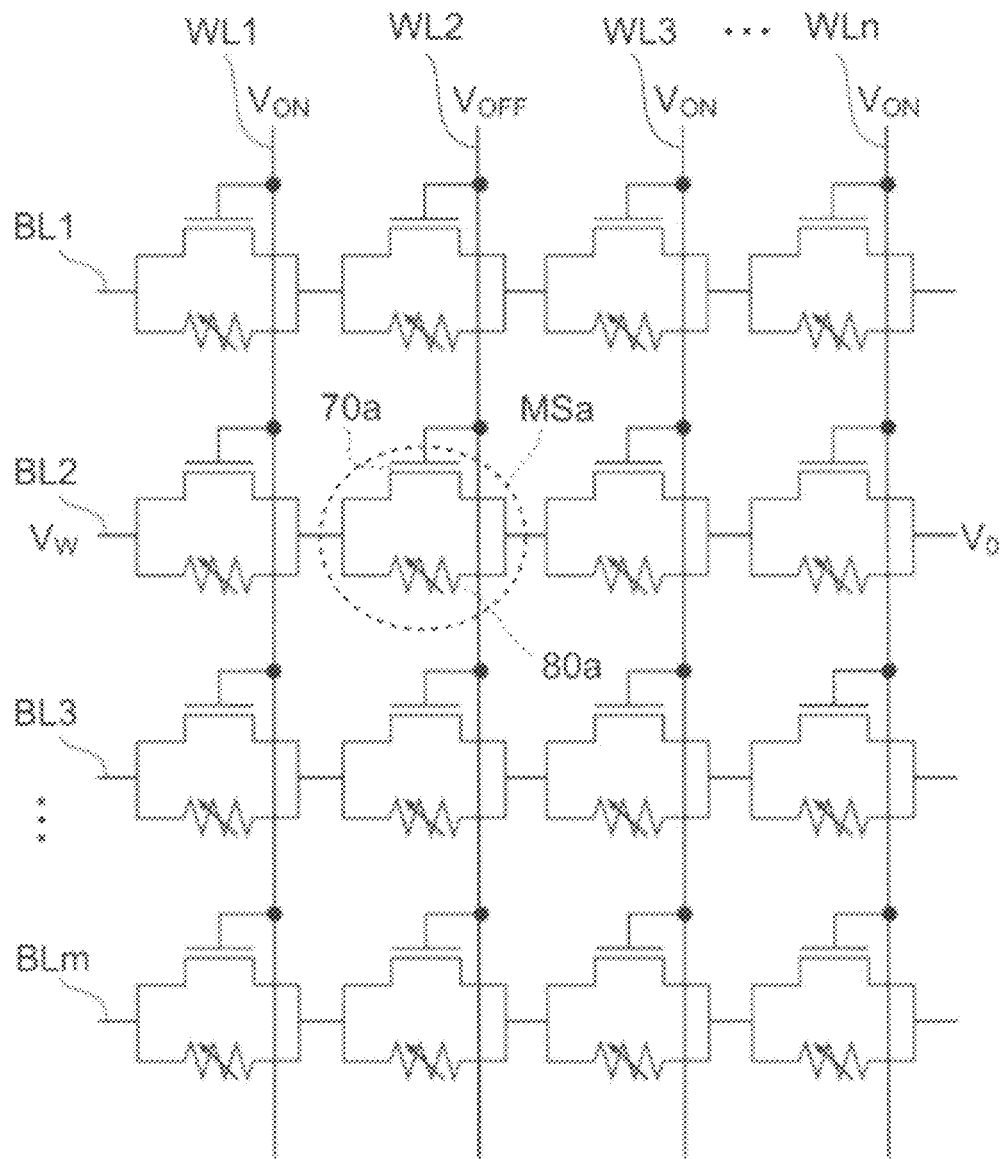
FIG. 23 is a schematic circuit diagram showing the operation of the nonvolatile memory device.

FIG. 23 is a schematic circuit diagram illustrating the operation of the nonvolatile memory device according to the fourth embodiment.

As shown in FIG. 23, in the case where information is written by changing an electrical resistance of a resistance change portion 80a of a selected memory section MSa, the voltage of the word line WL connected to the memory section MSa (in this case, second word line WL2) is set to an off-voltage $V_{OFF}$ to place an FET 70a of the memory section MSa in the non-conducting state. The word lines WL other than the selected word line WL (second word line WL2) are applied with an on-voltage $V_{ON}$ to place the FET 70 of the nonselected memory section MS in the conducting state. Furthermore, one end of the bit line BL (in this case, second bit line BL2) connected to the memory section MSa is applied with a write voltage $V_W$, and the other end is applied with a reference voltage $V_0$.

By using such voltages, the selected memory section MSa is applied with the difference voltage between the write voltage $V_W$ and the reference voltage $V_0$. By appropriately controlling this write voltage $V_W$, the electrical resistance of the resistance change portion 80a of the memory section MSa is changed, and information can be written.

The application voltage to the resistance change portion 80a of the selected memory section MSa and the current flowing therein can be controlled by the gate voltage applied to the FET 70 of each memory section MS corresponding to the bit line BL connected with the selected memory section MSa.

The read operation and the erase operation are performed by setting the voltage of the bit line BL to an appropriate value. Here, at the time of the read operation, the absolute value of the voltage applied to the selected memory section MSa is smaller than the application voltage at the time of the write operation and at the time of the erase operation.

Fifth Embodiment

Figure 24A:
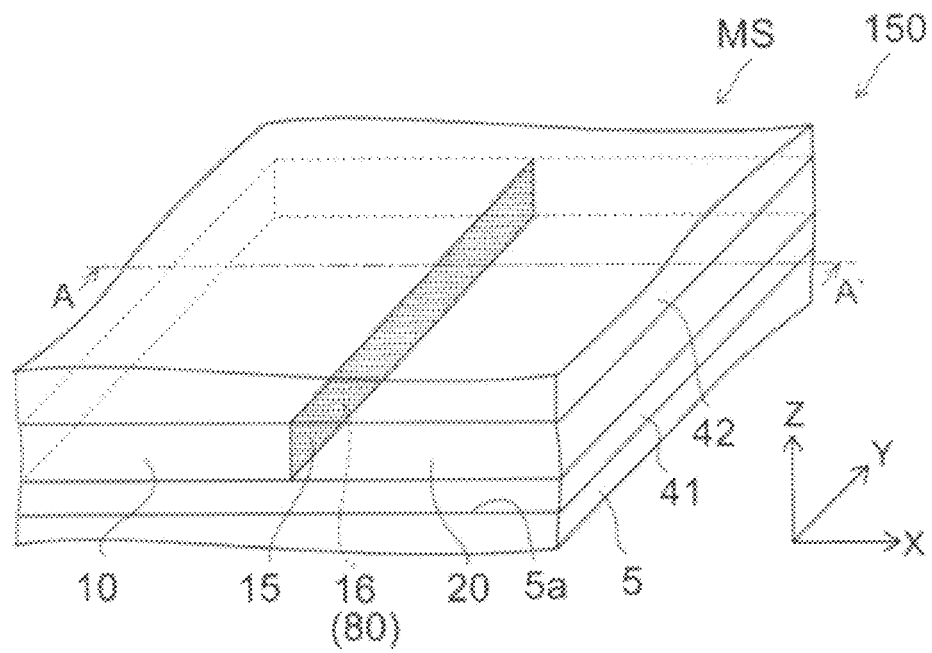
FIG. 24A and FIG. 24B are schematic views showing a nonvolatile memory device according to a fifth embodiment.
Figure 24B:
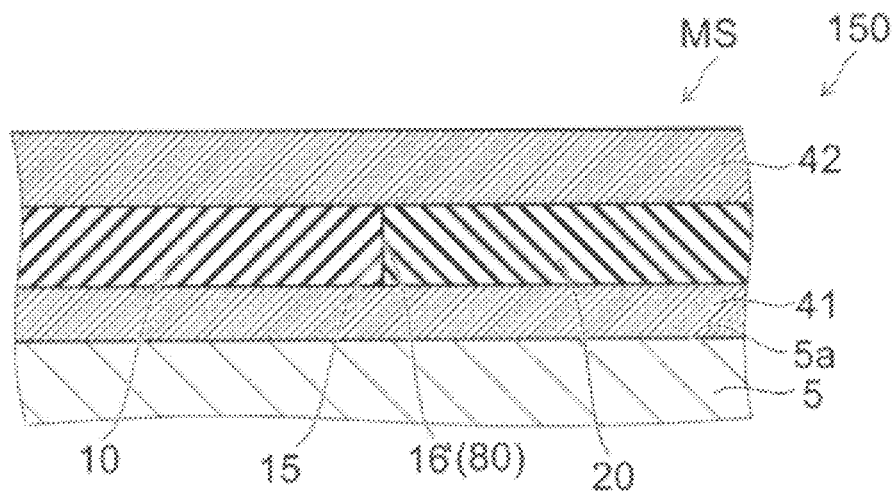

FIGS. 24A and 24B are schematic views illustrating the configuration of a nonvolatile memory device according to a fifth embodiment.

More specifically, FIG. 24A is a schematic perspective view, and FIG. 24B is a sectional view taken along line A-A' of FIG. 24A.

As shown in FIGS. 24A and 24B, the nonvolatile memory device 150 according to the embodiment includes the memory section MS. The memory section MS includes the first insulating layer 10, the second insulating layer 20, and the pair of electrodes (first electrode 41 and second electrode 42).

In the specific example, the first insulating layer 10 and the second insulating layer 20 are provided in substantially the same plane on the major surface 5a of a substrate 5.

The interface between the first insulating layer 10 and the second insulating layer 20 is non-parallel to the major surface 5a. In the specific example, the interface between the first insulating layer 10 and the second insulating layer 20 is perpendicular to the major surface 5a. The boundary portion between the first insulating layer 10 and the second insulating layer 20 is perpendicular to the major surface 5a. However, the interface (boundary portion 15) between the first insulating layer 10 and the second insulating layer 20 only needs to be non-parallel to the major surface 5a. The interface may be oblique to the major surface 5a. Alternatively, at least part of the interface may be a curved surface, or an uneven surface.

The second insulating layer 20 is formed in contact with the first insulating layer 10 after the first insulating layer 10 is formed. Thus, the boundary portion 15 between the first insulating layer 10 and the second insulating layer 20 is controllably formed in a prescribed shape.

The second insulating layer 20 is different from the first insulating layer 10 in at least one of composition and phase state.

The pair of electrodes (first electrode 41 and second electrode 42) can pass a current along the boundary portion 15 between the first insulating layer 10 and the second insulating layer 20. Also in this case, the current path 16 is formed in the boundary portion 15.

The first insulating layer 10, the second insulating layer 20, the first electrode 41, and the second electrode 42 can be based on the material and configuration described in the first embodiment.

In the nonvolatile memory device 150, the current path 16 is formed along the thickness direction of the first insulating layer 10 and the second insulating layer 20. Hence, the thickness of the first insulating layer 10 and the second insulating layer 20 is preferably set to within a fixed range. For instance, the thickness of the first insulating layer 10 and the second insulating layer 20 is preferably set to e.g. 5-50 nm. If the thickness of the first insulating layer 10 and the second insulating layer 20 is too thin, the resistance in the high resistance state decreases. Then, the threshold margin between the high resistance state and the low resistance state may be insufficient. Thus, the thickness of the first insulating layer 10 and the second insulating layer 20 is preferably 5 nm or more. If the thickness of the first insulating layer 10 and the second insulating layer 20 is too thick, the operating voltage increases. Thus, the thickness of the first insulating layer 10 and the second insulating layer 20 is preferably 50 nm or less.

The thickness of the first electrode 41 and the second electrode 42 can be set to e.g. 5-50 nm. The thickness thinner than 5 nm makes it difficult to achieve a uniform film thickness. Then, the characteristics may be unstable. The thickness thicker than 50 nm may decrease the processability. Here, the first electrode 41 and the second electrode 42 are preferably made of the same material.

The nonvolatile memory device 150 thus configured is suitably applicable to a nonvolatile memory device of the cross-point type.

In the following, an example method for manufacturing the nonvolatile memory device 150 is described.

Figure 25A:
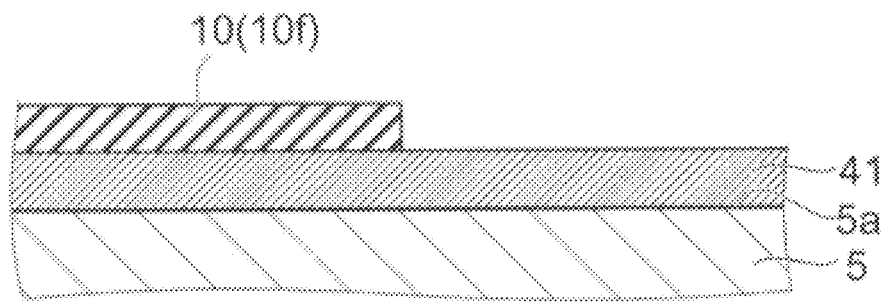
FIG. 25A and FIG. 25B and FIG. 25C are sequential schematic sectional views showing a method for manufacturing the nonvolatile memory device.
Figure 25B:
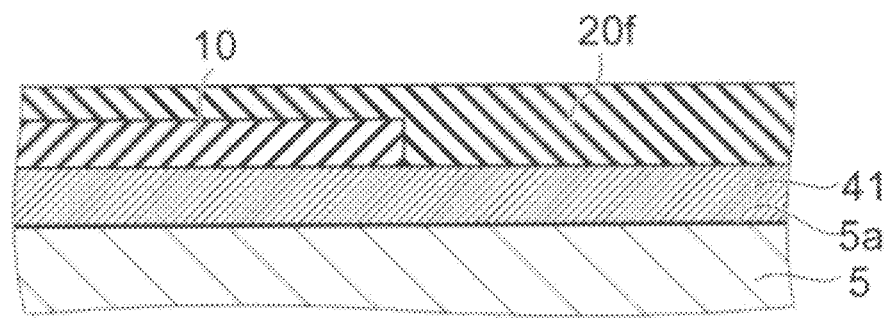
Figure 25C:
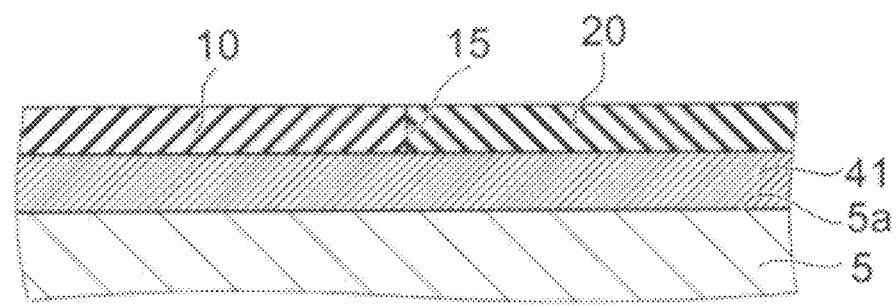

FIGS. 25A to 25C are sequential schematic sectional views illustrating a method for manufacturing the nonvolatile memory device according to the fifth embodiment.

As shown in FIG. 25A, for instance, on the major surface 5a of the substrate 5 including semiconductor, the first electrode 41 is formed. Subsequently, a first insulating layer film 10f constituting the first insulating layer 10 is formed thereon. Then, by photolithography and etching, the first insulating layer film 10f is processed into a prescribed shape to form the first insulating layer 10. Simultaneously, part of the first electrode 41 is exposed. Here, the shape of the first insulating layer 10 is arbitrary. Its cross-sectional shape may be a circle or quadrangle, or may be shaped like a strip. The side surface of the first insulating layer 10 may be planar or curved as long as the side surface is non-parallel to the major surface 5a of the substrate 5.

Next, as shown in FIG. 25B, a second insulating layer film 20f constituting the second insulating layer 20 is formed on the first insulating layer 10 and on the exposed first electrode 41.

Then, as shown in FIG. 25C, an upper surface of the second insulating layer film 20f is ground by e.g. CMP to reduce the thickness. Accordingly, the surface of the first insulating layer 10 is exposed. Thus, the second insulating layer 20 is formed.

Subsequently, the second electrode 42 is formed on the first insulating layer 10 and the second insulating layer 20. Thus, the nonvolatile memory device 150 illustrated in FIGS. 24A and 24B can be formed.

In the nonvolatile memory device 150, the current path 16 operable for at least one of the first and second mechanisms is formed in the boundary portion 15 between the first insulating layer 10 and the second insulating layer 20 having different compositions and phase states. This eliminates the need for the forming process. Furthermore, because the current path 16 is formed in the boundary portion 15, the position and shape of the current path 16 are accurately controlled. Thus, the embodiment can provide a nonvolatile memory device of the resistance change type with stable characteristics in which the position and shape of the current path in the resistance change portion are accurately controlled.

Also in this case, the forming process may be performed. In this case, conditions with reduced application voltage and stress can be used in the forming process. This suppresses occurrence of e.g. device destruction.

Sixth Embodiment

Figure 26A:
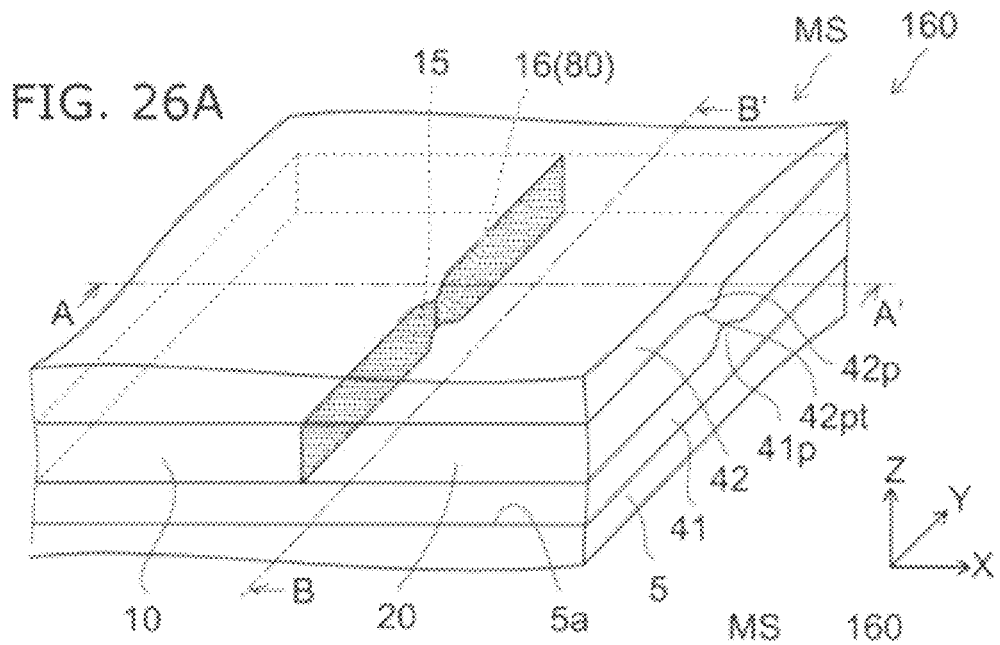
FIG. 26A and FIG. 26B and FIG. 26C are schematic views showing a nonvolatile memory device according to a sixth embodiment.
Figure 26B:
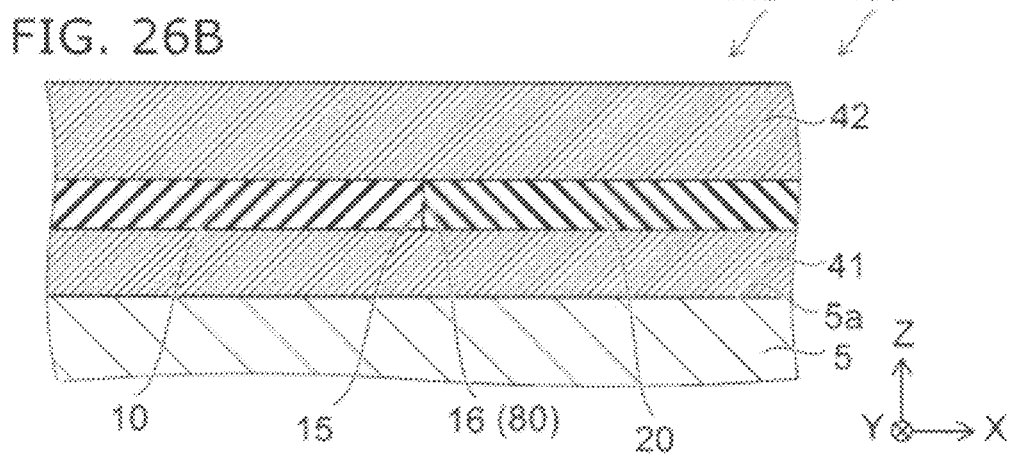
Figure 26C:
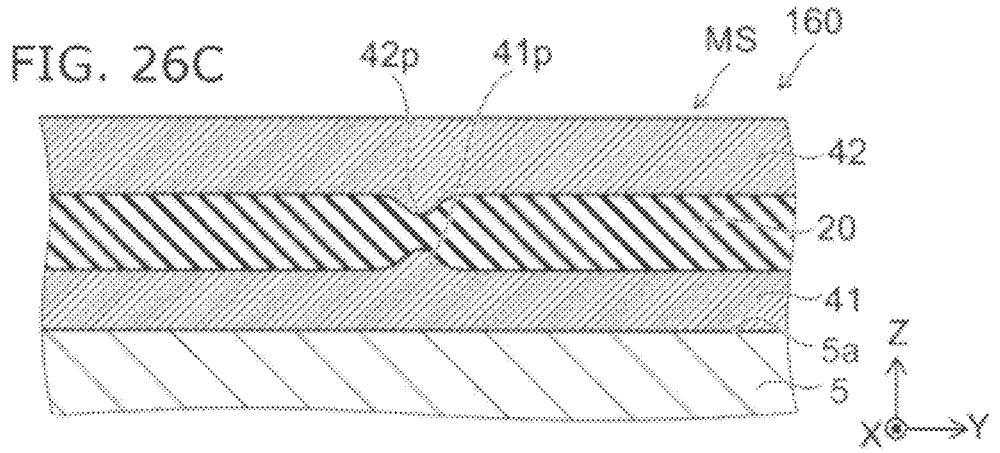

FIGS. 26A to 26C are schematic views illustrating the configuration of a nonvolatile memory device according to a sixth embodiment.

More specifically, FIG. 26A is a schematic perspective view. FIG. 26B is a sectional view taken along line A-A' of FIG. 26A, i.e., a sectional view with the memory section MS cut along the X-Z plane. FIG. 26C is a sectional view taken along line B-B' of FIG. 26A, i.e., a sectional view with the memory section MS cut along the Y-Z plane.

As shown in FIGS. 26A to 26C, the memory section MS of the nonvolatile memory device 160 according to the embodiment is different from the memory section MS of the nonvolatile memory device 150 in that the first electrode 41 and the second electrode 42 include the first protrusion 41p and the second protrusion 42p, respectively. The first protrusion 41p and the second protrusion 42p protrude in the directions facing each other. In this case, the protruding directions of the first protrusion 41p and the second protrusion 42p lie along the Z-axis direction, and are directed oppositely.

In the specific example, the boundary portion 15 (interface) between the first insulating layer 10 and the second insulating layer 20 extends in the Y-axis direction in the Y-Z plane. On the other hand, the first protrusion 41p and the second protrusion 42p both extend in the X-axis direction.

That is, in the portion where the first protrusion 41p and the second protrusion 42p are faced to each other, the distance between the first electrode 41 and the second electrode 42 is minimized. This portion constitutes an electric field concentration portion. That is, the electric field concentration portion extends in the X-axis direction. The current path 16 is formed in the facing portion between this electric field concentration portion and the Y-Z plane including the boundary portion 15. Thus, the position and shape of the current path 16 can be controlled with higher accuracy by both the boundary portion 15 and the electric field concentration portion.

Here, it is also possible to provide one of the first protrusion 41p and the second protrusion 42p described above. The shape of the first protrusion 41p and the second protrusion 42p is arbitrary, and is not limited to a strip shape. In the case of the strip shape, it is only necessary that at least part of the strip in the extending direction faces the boundary portion 15. The first protrusion 41p and the second protrusion 42p can be configured in arbitrary shapes such as a cylinder, cone, polygonal prism, and polygonal pyramid.

In the following, an example method for manufacturing the nonvolatile memory device 160 is described.

FIGS. 27A and 27B are flow charts illustrating methods for manufacturing the nonvolatile memory device according to the sixth embodiment.

That is, FIGS. 27A and 27B illustrate different manufacturing methods.

The method for manufacturing the nonvolatile memory device according to the embodiment is a method for manufacturing a nonvolatile memory device including the memory section MS. The memory section MS includes the first insulating layer 10, the second insulating layer 20 different from the first insulating layer 10 in at least one of composition and phase state, and the pair of electrodes (first electrode 41 and second electrode 42) capable of passing the current in and along the boundary portion 15 between the first insulating layer 10 and the second insulating layer 20. The electrical resistance of the current path where the current is passed is changed by the voltage applied between the pair of electrodes. The method performs the following.

First, in the case of providing the above first protrusion 41p, the following is performed, for instance.

As shown in FIG. 27A, first, a first conductive film constituting the first electrode 41 is formed on the major surface 5a of the substrate 5. By using techniques such as lithography and etching, the first protrusion 41p is formed at the upper surface of the first conductive film. Thus, the first electrode 41 including a protrusion is formed (step S140a).

Then, the first insulating layer 10 is formed on the first electrode 41 (step S110). Then, on the first insulating layer 10, a second insulating layer film different from the first insulating layer 10 in at least one of composition and phase state is formed so that the first insulating layer 10 is exposed from the surface of the second insulating layer film. Thus, the second insulating layer 20 is formed (step S120).

Then, a second conductive film is formed on the first insulating layer 10 and the second insulating layer 20. Thus, the second electrode 42 is formed (step S150).

In the case of providing the above second protrusion 42p, the following is performed, for instance.

As shown in FIG. 27B, first, a first conductive film constituting the first electrode 41 is formed on the major surface 5a of the substrate 5 (step S140).

Then, the first insulating layer 10 is formed on the first electrode 41 (step S110). Then, on the first insulating layer 10, a second insulating layer film different from the first insulating layer 10 in at least one of composition and phase state is formed so that the first insulating layer 10 is exposed from the surface of the second insulating layer film. Thus, the second insulating layer 20 is formed (step S120).

Then, by using techniques such as lithography and etching, a groove is formed at the upper surface of at least one of the first insulating layer 10 and the second insulating layer 20 (step S160).

Then, a second conductive film is formed on the first insulating layer 10 and the second insulating layer 20. Thus, the second electrode 42 is formed (step S150). Accordingly, the second conductive film is embedded in the above groove formed in at least one of the first insulating layer 10 and the second insulating layer 20. Thus, the second protrusion 42p is formed.

In the case of forming both the first protrusion 41p and the second protrusion 42p, the above processes are performed in combination.

In the following, examples are described.

FIGS. 28A to 28D are schematic views illustrating the method for manufacturing the nonvolatile memory device according to the sixth embodiment.

Figure 28A:
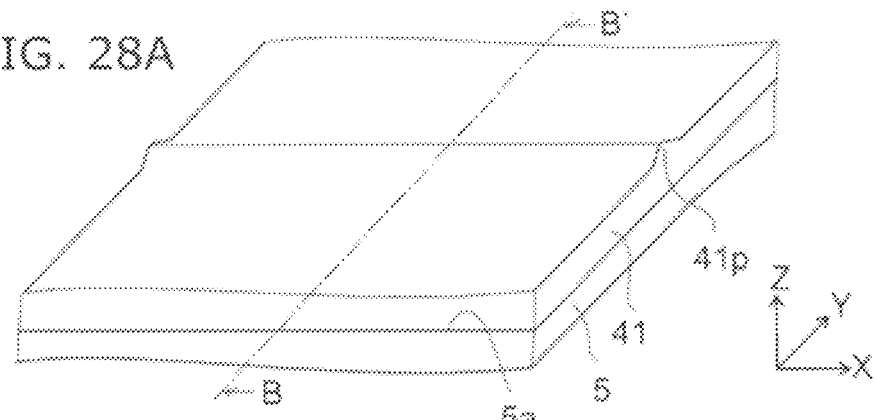
FIG. 28A and FIG. 28B and FIG. 28C and FIG. 28D are schematic views showing the method for manufacturing the nonvolatile memory device.
Figure 28B:
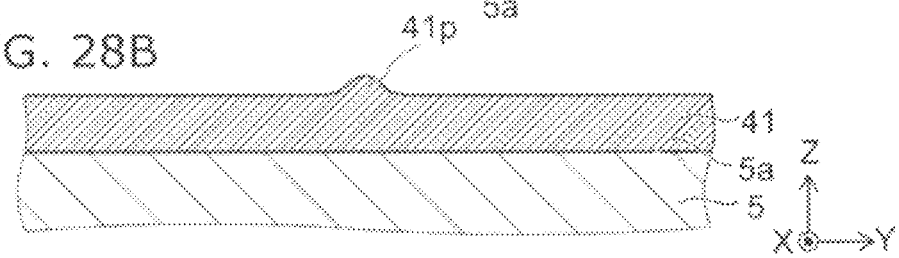
Figure 28C:
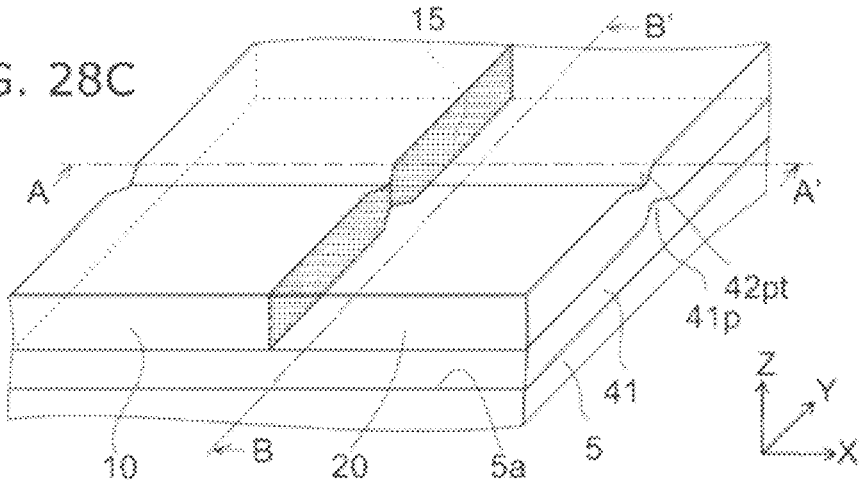
Figure 28D:
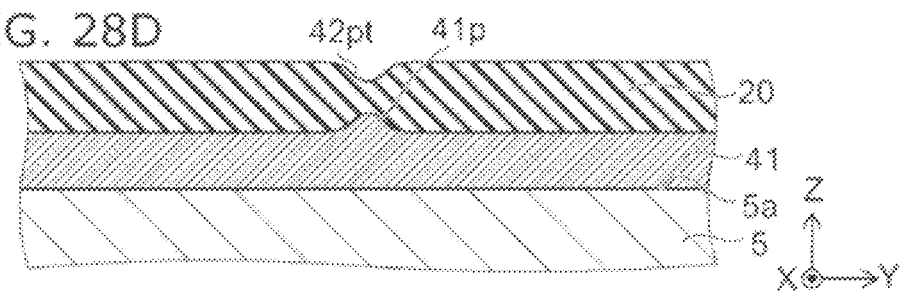

More specifically, FIGS. 28A and 28C are schematic perspective views illustrating different processes. FIGS. 28B and 28D are sectional views taken along line B-B' of FIGS. 28A and 28C, respectively.

As shown in FIGS. 28A and 28B, for instance, on the major surface 5a of the substrate 5 including semiconductor, a first conductive film constituting the first electrode 41 is formed. Subsequently, for instance, by etching using a prescribed resist, the first protrusion 41p extending in the X-axis direction is formed at the upper surface of the first conductive film. Thus, the first electrode 41 is formed (step S140*a*).

Subsequently, by a method similar to that described with reference to FIGS. 25A to 25C, the first insulating layer 10 and the second insulating layer 20 are formed on the first electrode 41 (step S110 and step S120). Here, the boundary portion 15 between the first insulating layer 10 and the second insulating layer 20 extends in the Y-axis direction.

Subsequently, as shown in FIGS. 28C and 28D, for instance, by etching using a prescribed resist, a groove portion 42*pt* (groove) extending in the X-axis direction is formed at the upper surface of the first insulating layer 10 and the second insulating layer 20 (step S160).

Subsequently, a second conductive film is formed on the first insulating layer 10 and the second insulating layer 20. Thus, the second electrode 42 is formed (step S150). Accordingly, this second conductive film is embedded in the groove portion 42*pt*. This portion constitutes the second protrusion 42*p*. Thus, the second electrode 42 including the second protrusion 42*p* is formed.

Figure 29A:
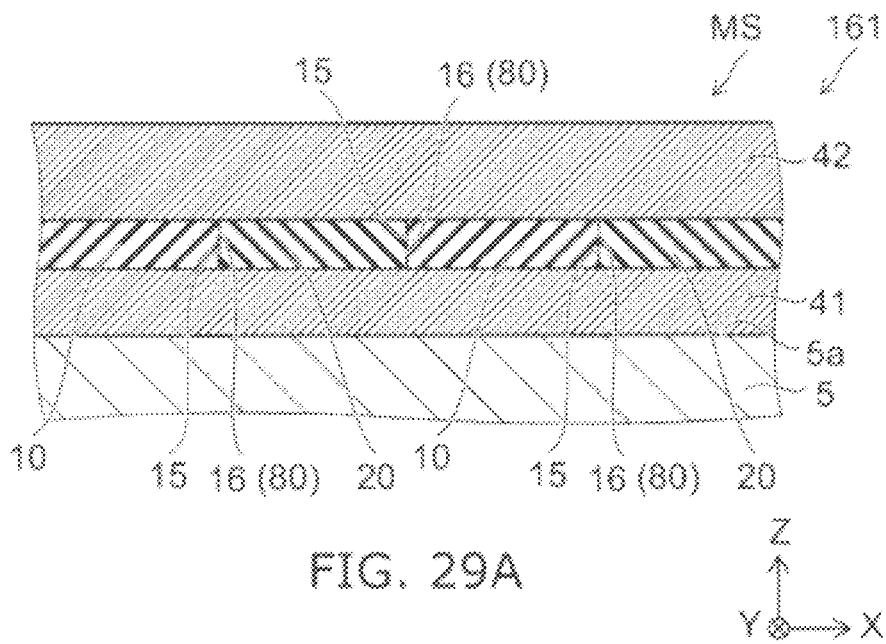
FIG. 29A and FIG. 29B are schematic sectional views showing another nonvolatile memory device according to the sixth embodiment.
Figure 29B:
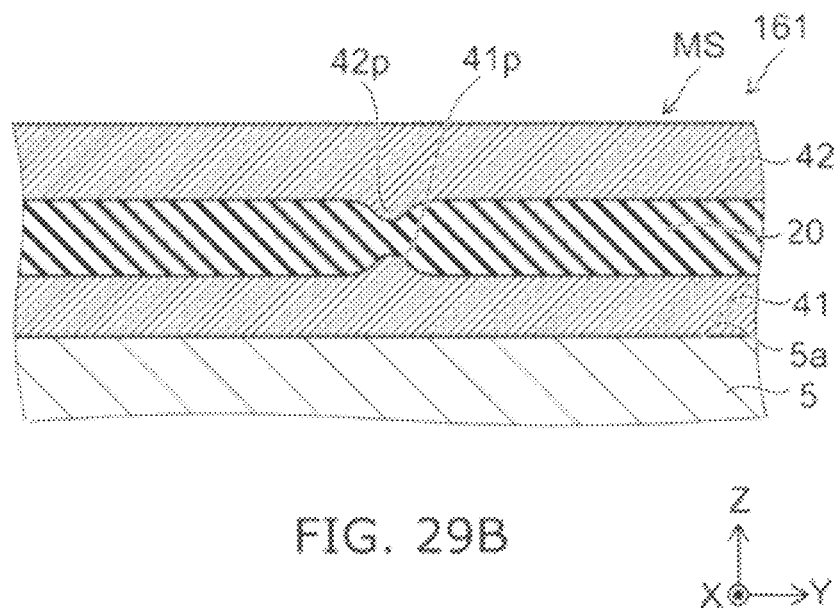

FIGS. 29A and 29B are schematic sectional views illustrating the configuration of another nonvolatile memory device according to the sixth embodiment.

More specifically, FIGS. 29A and 29B are sectional views corresponding to the A-A' cross section and B-B' cross section of FIG. 26A.

As shown in FIGS. 29A and 29B, the memory section MS of the another nonvolatile memory device 161 according to the embodiment includes a plurality of boundary portions 15 between the first electrode 41 and the second electrode 42. That is, a plurality of first insulating layers 10 and a plurality of second insulating layers 20 are alternately provided so that the first insulating layer 10 and the second insulating layer 20 are in contact with each other. This structure can be formed by changing the pattern shape of the first insulating layer 10 in the process described with reference to FIGS. 25A to 25C.

Thus, for one combination of the first electrode 41 and the second electrode 42, the boundary portions 15 can be provided in an arbitrary number and arbitrary shape.

Seventh Embodiment

Figure 30A:
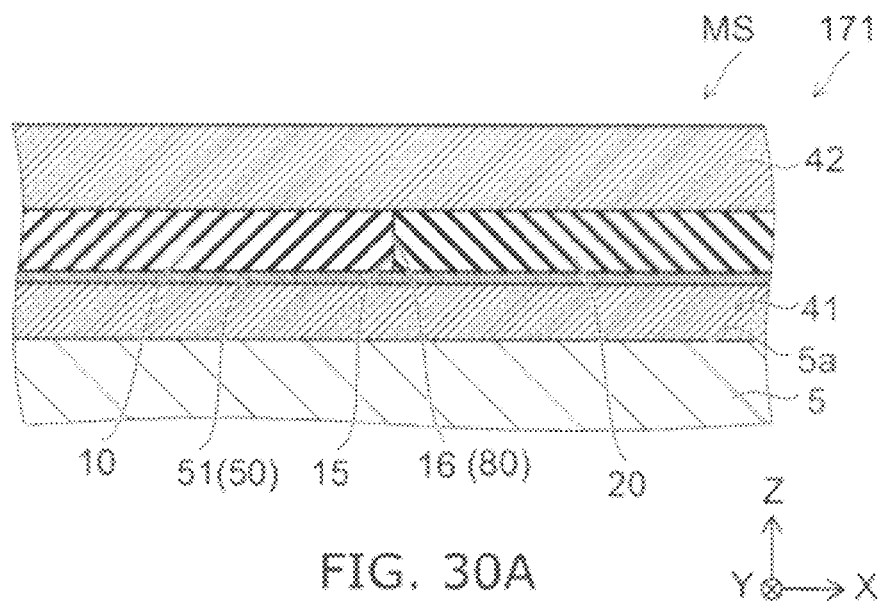
FIG. 30A and FIG. 30B are schematic sectional views showing a nonvolatile memory device according to a seventh embodiment.
Figure 30B:
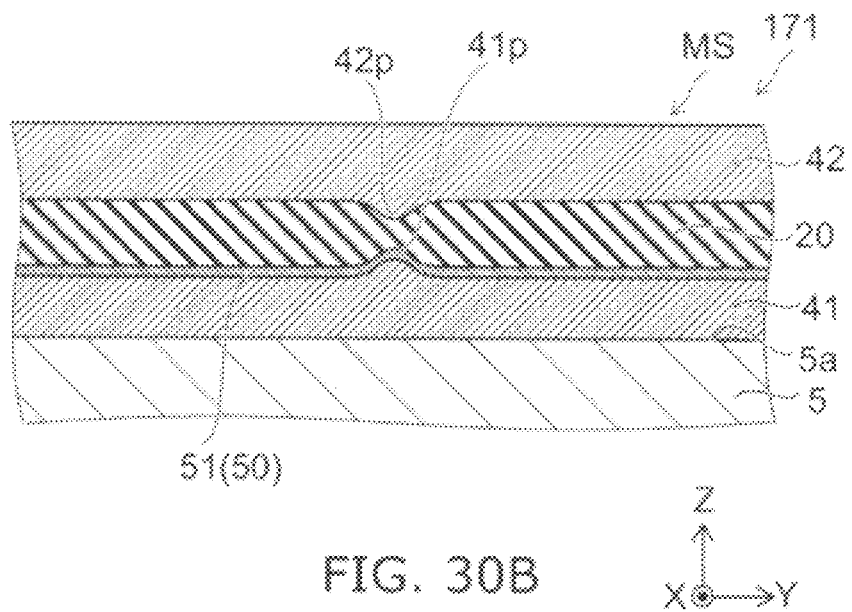

FIGS. 30A and 30B are schematic sectional views illustrating the configuration of a nonvolatile memory device according to a seventh embodiment.

More specifically, FIGS. 30A and 30B are sectional views corresponding to the A-A' cross section and B-B' cross section of FIG. 26A.

As shown in FIGS. 30A and 30B, the memory section MS of the nonvolatile memory device 171 according to the embodiment is different from the memory section MS of the nonvolatile memory device 160 in including the first intermediate layer 51 (intermediate layer 50). The remaining configuration can be made similar to that of the nonvolatile memory device 160, and hence the description thereof is omitted.

The first intermediate layer 51 is provided on the first electrode 41. The first insulating layer 10 and the second insulating layer 20 are provided on the first intermediate layer 51.

Figure 31A:
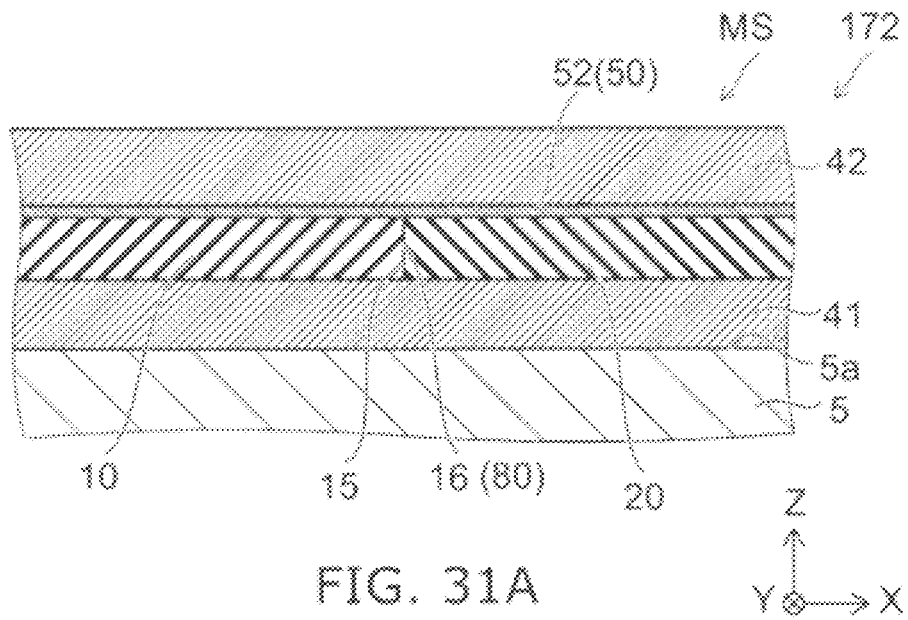
FIG. 31A and FIG. 31B are schematic sectional views showing another nonvolatile memory device according to the seventh embodiment.
Figure 31B:
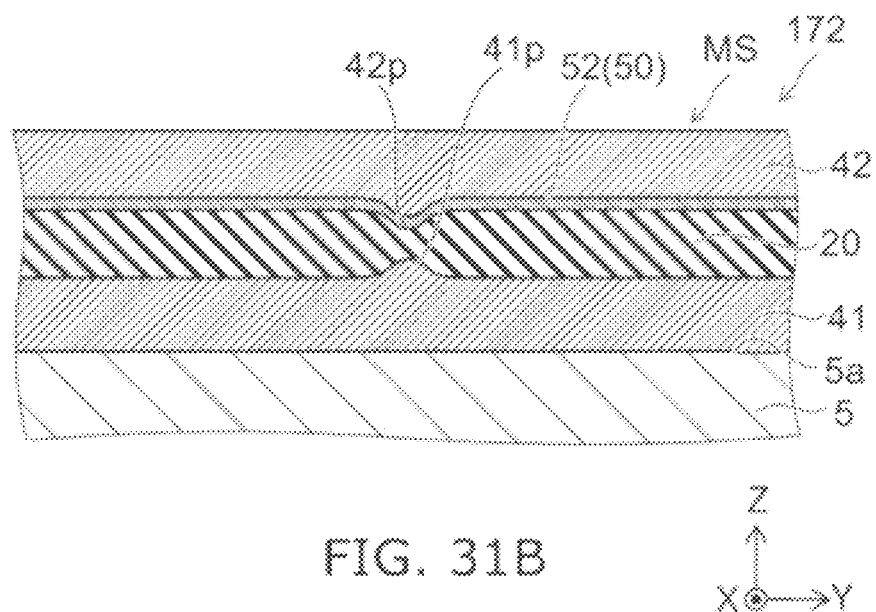

FIGS. 31A and 31B are schematic sectional views illustrating the configuration of another nonvolatile memory device according to the seventh embodiment.

More specifically, FIGS. 31A and 31B are sectional views corresponding to the A-A' cross section and B-B' cross section of FIG. 26A.

As shown in FIGS. 31A and 31B, the memory section MS of the another nonvolatile memory device 172 according to the embodiment is different from the memory section MS of the nonvolatile memory device 160 in including the second intermediate layer 52 (intermediate layer 50). The remaining configuration can be made similar to that of the memory section MS of the nonvolatile memory device 160, and hence the description thereof is omitted.

The second intermediate layer 52 is provided on the first insulating layer 10 and the second insulating layer 20. The second electrode 42 is provided on the intermediate layer 52.

In the nonvolatile memory devices 171 and 172, the third mechanism described above can be used.

Here, it is also possible to provide both the first intermediate layer 51 and the second intermediate layer 52 described above.

It is also possible to use a configuration in which the third mechanism achieved in the embodiment is combined with at least one of the first and second mechanisms.

The nonvolatile memory device 150 can also include one or both of the first intermediate layer 51 and the second intermediate layer 52.

The embodiments thus provide a nonvolatile memory device of the resistance change type with stable characteristics in which the position and shape of the current path in the resistance change portion are accurately controlled.

The embodiments of the invention have been described above with reference to specific examples. However, the invention is not limited to these examples. For instance, various specific configurations of the components such as the first insulating layer, second insulating layer, first electrode, second electrode, boundary portion, reaction layer, substrate, FET, word line, and bit line constituting the nonvolatile memory device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the nonvolatile memory device described above in the embodiments of the invention. All the nonvolatile memory devices thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
   a memory section including:
      a first insulating layer having a first state selected from the group consisting_of a monocrystalline state, a polycrystalline state, a microcrystalline state, an amorphous state, and a crystal orientation,
      a second insulating layer formed on and in contact with the first insulating layer, the second insulating layer having at least one of a composition different from a composition of the first insulating layer and a second state different from the first state, the second state selected from the group consisting of a monocrystalline state, a polycrystalline state, a microcrystalline state, an amorphous state, and a crystal orientation, and
      a first electrode and a second electrode capable of passing a current through a current path along a boundary portion between the first insulating layer and the second insulating layer, the first electrode having a first side surface, the second electrode having a second side surface opposing the first side surface, a first part of the first side surface opposing the first insulating layer and a second part of the first side surface opposing the second insulating layer being in a same plane, a third part of the second side surface opposing the first insulating layer and a fourth part of the second side surface opposing the second insulating layer being in a same plane; and
   a writing section configured to apply a voltage difference between the first and second electrodes to cause an electrical resistance of the current path to be changed by the voltage difference in a writing operation,
   wherein the boundary portion includes a conductive element and the conductive element is unevenly distributed in the boundary portion.

2. The device according to claim 1, wherein
   the memory section further includes a substrate having a major surface,
   the first insulating layer is provided on the major surface, and
   the second insulating layer is provided on the first insulating layer.

3. The device according to claim 2, wherein an interface between the first insulating layer and the second insulating layer is parallel to the major surface.

4. The device according to claim 3, wherein the first and second side surfaces extend in a first direction perpendicular to the major surface and penetrate through the interface between the first insulating layer and the second insulating layer.

5. The device according to claim 4, wherein at least one of the first and second electrodes includes a protrusion protruding toward another one of the first and second electrodes, and the protrusion protrudes in a direction parallel to the major surface.

6. The device according to claim 1, wherein at least one of the first insulating layer and the second insulating layer includes an oxide including one selected from the group consisting of Ti, V, Mn, Co, Ni, Zr, Hf, Pr, Al, and Si.

7. The device according to claim 1, wherein at least one of the first insulating layer and the second insulating layer includes an oxide including one selected from the group consisting of Al and Si.

8. The device according to claim 1, wherein the boundary portion includes a conductive element, and concentration of the conductive element in the boundary portion is higher than concentration of the conductive element in other portion of the first insulating layer and the second insulating layer.

9. The device according to claim 8, wherein the conductive element includes at least one selected from the group consisting of Al, Si, Ti, Co, Ni, Cu, Sr, Y, Pd, Ag, Ta, Pt, Au, La, Sm, Er, Yb, and Lu.

10. The device according to claim 1, wherein the boundary portion contains a conductive element injected from at least one of the first and second electrodes and concentration of the conductive element in the boundary portion is higher than concentration of the conductive element in another portion of the first insulating layer and the second insulating layer.

11. The device according to claim 8, wherein the conductive element includes at least one of Ag and Cu.

12. The device according to claim 1, wherein the memory section further includes an intermediate layer provided between at least one of the first and second electrodes and the boundary portion, and being capable of reaction of at least one of oxidation and reduction based on the current.

13. The device according to claim 2, wherein at least one of the first and second electrodes includes a protrusion protruding toward another one of the first and second electrodes, and the protrusion protrudes in a direction parallel to the major surface.

14. The device according to claim 2, wherein the writing section includes a field effect transistor,
   the field effect transistor including:
      a semiconductor layer including a source region, a drain region, and a channel region provided between the source region and the drain region;
      a gate insulating film provided on the channel region; and
      a gate electrode provided on the gate insulating film,
   the first electrode is electrically connected to the source region, and the second electrode is electrically connected to the drain region.

15. The device according to claim 14, wherein the gate electrode is disposed between the first insulating layer and the semiconductor layer, and between the second insulating layer and the semiconductor layer.

16. The device according to claim 15, further comprising:
   an interlayer insulating layer provided between the first insulating layer and the field effect transistor, and between the second insulating layer and the field effect transistor,
   the first and second electrodes penetrating through the interlayer insulating layer along a first direction perpendicular to the major surface.

17. The device according to claim 14, wherein the semiconductor layer is disposed between the first insulating layer and the gate electrode, and between the second insulating layer and the gate electrode.

18. The device according to claim 17, further comprising:
   an interlayer insulating layer covering the field effect transistor,
   the first and second electrodes penetrating through the interlayer insulating layer along a first direction perpendicular to the major surface.

19. The device according to claim 2, wherein an interface between the first insulating layer and the second insulating layer is non-parallel to the major surface.

20. The device according to claim 2, wherein an interface between the first insulating layer and the second insulating layer is perpendicular to the major surface.

21. The device according to claim 1, wherein the voltage difference is applied only between the first and second electrodes in the writing operation.

22. The device according to claim 1, wherein the first and second insulating layers each comprise an oxide, and the current path includes one of an oxygen deficiency and an oxygen excess.

23. A nonvolatile memory device, comprising:
a memory section including:
a first insulating layer having a first state selected from the group consisting of a monocrystalline state, a polycrystalline state, a microcrystalline state, an amorphous state, and a crystal orientation,
a second insulating layer formed on and in contact with the first insulating layer, the second insulating layer having at least one of a composition different from a composition of the first insulating layer and a second state different from the first state, the second state selected from the group consisting of a monocrystalline state, a polycrystalline state, a microcrystalline state, an amorphous state, and a crystal orientation, and
a first electrode and a second electrode capable of passing a current through a current path along a boundary portion between the first insulating layer and the second insulating layer, the first electrode having a first side surface, the second electrode having a second side surface opposing the first side surface, a first part of the first side surface opposing the first insulating layer and a second part of the first side surface opposing the second insulating layer being in a same plane, a third part of the second side surface opposing the first insulating layer and a fourth part of the second side surface opposing the second insulating layer being in a same plane;
a writing section configured to apply a voltage difference between the first and second electrodes to cause an electrical resistance of the current path to be changed by the voltage difference in a writing operation,
a third insulating layer formed on and in contact with the second insulating layer, the third insulating layer having at least one of a composition different from a composition of the second insulating layer and a third state different from the second state, the third state selected from the group consisting of a monocrystalline state, a polycrystalline state, a microcrystalline state, an amorphous state, and a crystal orientation; and
a second boundary portion formed between the second and third insulating layers,
the first electrode and the second electrode capable of passing a current through a second current path along the second boundary portion between the second insulating layer and the third insulating layer, a fifth part of the first side surface opposing the third insulating layer and being in the same plane as the first and second parts, and a sixth part of the second side surface opposing the third insulating layer being in a same plane as the third and fourth parts, and
the writing section configured to apply a voltage difference between the first and second electrodes to cause an electrical resistance of the second current path to be changed by the voltage difference in the writing operation.

\* \* \* \* \*